United States Patent
Shibata et al.

(10) Patent No.: US 10,038,335 B2
(45) Date of Patent: Jul. 31, 2018

(54) POWER SUPPLY SYSTEM AND POWER SUPPLY CONTROLLER

(71) Applicant: KABUSHIKI KAISHA TOSHIBA, Minato-ku, Tokyo (JP)

(72) Inventors: Akihiro Shibata, Tokyo (JP); Tatsunori Kanai, Kanagawa-ken (JP); Koichi Fujisaki, Kanagawa-ken (JP); Nobuo Shibuya, Kanagawa-ken (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 1147 days.

(21) Appl. No.: 14/019,760

(22) Filed: Sep. 6, 2013

(65) Prior Publication Data

US 2014/0077604 A1 Mar. 20, 2014

(30) Foreign Application Priority Data

Sep. 19, 2012 (JP) .................. 2012-205829

(51) Int. Cl.
*H02J 9/00* (2006.01)
*H02J 9/06* (2006.01)
(Continued)

(52) U.S. Cl.
CPC ........ *H02J 9/061* (2013.01); *H01L 31/02021* (2013.01); *H02S 40/38* (2014.12);
(Continued)

(58) Field of Classification Search
CPC ....................................................... H02J 9/00
(Continued)

(56) References Cited

U.S. PATENT DOCUMENTS

2005/0200335 A1 9/2005 Yano
2009/0086520 A1* 4/2009 Nishimura ........ H02M 3/33576
363/133
(Continued)

FOREIGN PATENT DOCUMENTS

CN 201328017 10/2009
JP 11-46459 2/1999
(Continued)

OTHER PUBLICATIONS

Office Action of Notification of Reason(s) for Refusal for Japanese Patent Application No. 2012-205829 dated Jul. 8, 2014, 10 pages.
(Continued)

*Primary Examiner* — Rexford Barnie
*Assistant Examiner* — Joseph Inge
(74) *Attorney, Agent, or Firm* — Oblon, McClelland, Maier & Neustadt, L.L.P.

(57) ABSTRACT

According to an embodiment, a power supply system includes a power storage unit, a changeover unit, and a control unit. The power storage unit is configured to store electric power generated by a power generation unit. The changeover unit is configured to make a changeover between a first state in which a load is connected to the power generation unit and a second state in which the load is connected to the power storage unit but not the power generation unit. The control unit is configured to perform control to make the changeover to the first state when a value obtained by subtracting a first value from a value of the electric power fed from the power generation unit is not less than a value of the electric power fed to the load. Otherwise, the control unit is configured to perform control to make the changeover to the second state.

3 Claims, 20 Drawing Sheets

(51) Int. Cl.
*H01L 31/02* (2006.01)
*H02S 40/38* (2014.01)
*H02J 7/35* (2006.01)

(52) U.S. Cl.
CPC ............... *H02J 7/35* (2013.01); *Y02B 10/72* (2013.01); *Y02E 10/50* (2013.01); *Y10T 307/625* (2015.04)

(58) Field of Classification Search
USPC .......................................................... 307/66
See application file for complete search history.

(56) References Cited

U.S. PATENT DOCUMENTS

| | | | | |
|---|---|---|---|---|
| 2012/0226387 A1* | 9/2012 | Kawaguchi | ............... | H02J 3/32 700/295 |
| 2012/0226572 A1* | 9/2012 | Park | ............... | H02J 3/14 705/26.1 |
| 2012/0246356 A1 | 9/2012 | Shibata et al. | | |
| 2012/0246390 A1 | 9/2012 | Kanai et al. | | |
| 2012/0246501 A1 | 9/2012 | Haruki et al. | | |
| 2012/0246503 A1 | 9/2012 | Fujisaki et al. | | |
| 2013/0049695 A1* | 2/2013 | Baba | ............... | H02J 3/32 320/128 |
| 2013/0073812 A1 | 3/2013 | Kanai et al. | | |
| 2013/0080812 A1 | 3/2013 | Shirota et al. | | |
| 2013/0080813 A1 | 3/2013 | Tarui et al. | | |
| 2013/0091372 A1 | 4/2013 | Kimura et al. | | |
| 2013/0191670 A1 | 7/2013 | Haruki et al. | | |
| 2013/0219203 A1 | 8/2013 | Fujisaki et al. | | |

FOREIGN PATENT DOCUMENTS

| | | |
|---|---|---|
| JP | 11-289687 | 10/1999 |
| JP | 2005-261018 | 9/2005 |
| JP | 2009-033797 | 2/2009 |
| JP | 2011-250608 | 12/2011 |

OTHER PUBLICATIONS

Notification of the First Office Action for Chinese Patent Application No. 201310388942.7 dated Sep. 6, 2015, 13 pages.
Japanese Office Action for Japanese Patent Application No. 2012-205829 dated Sep. 30, 2014.
Taiwanese Office Action for Taiwanese Patent Application No. 102132625 dated Aug. 25, 2015.
Yamamoto, Solar Cell Applied Technology (The Nikkan Kogyo Shimbun Ltd ISBN: 978-4-526-06337-4) p. 53, 2009.

* cited by examiner

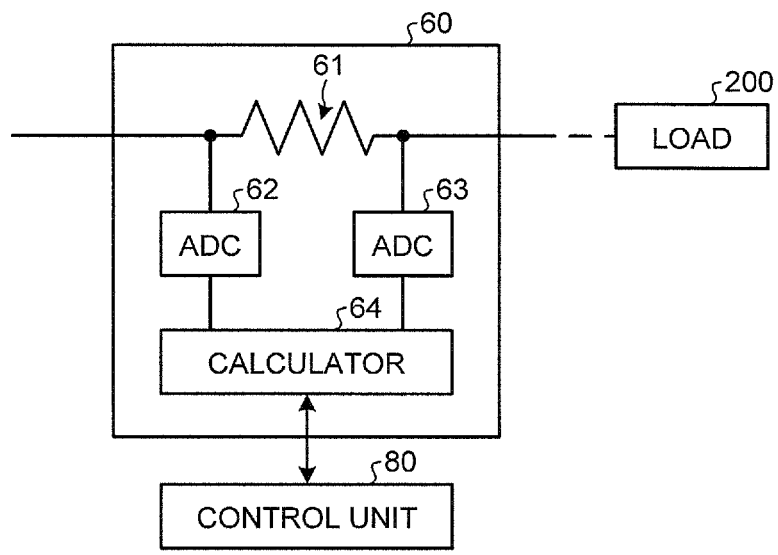
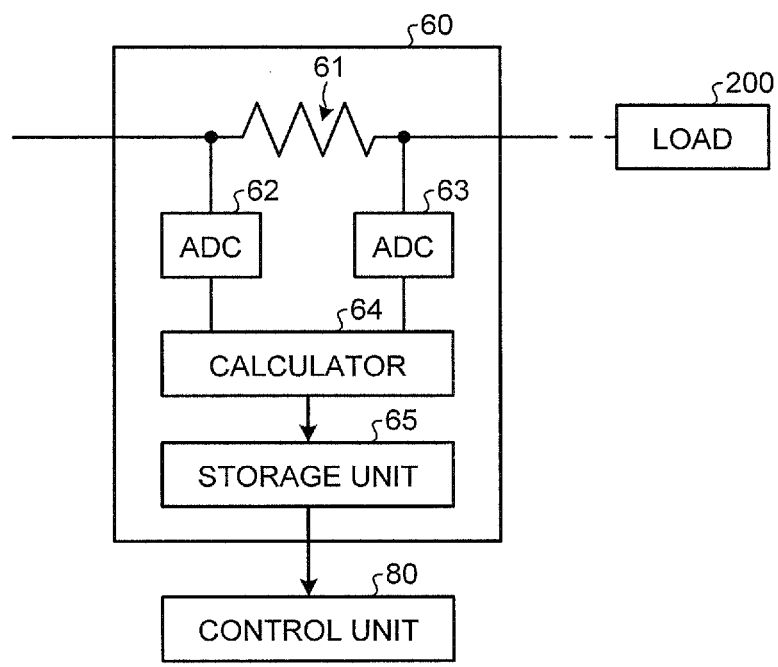

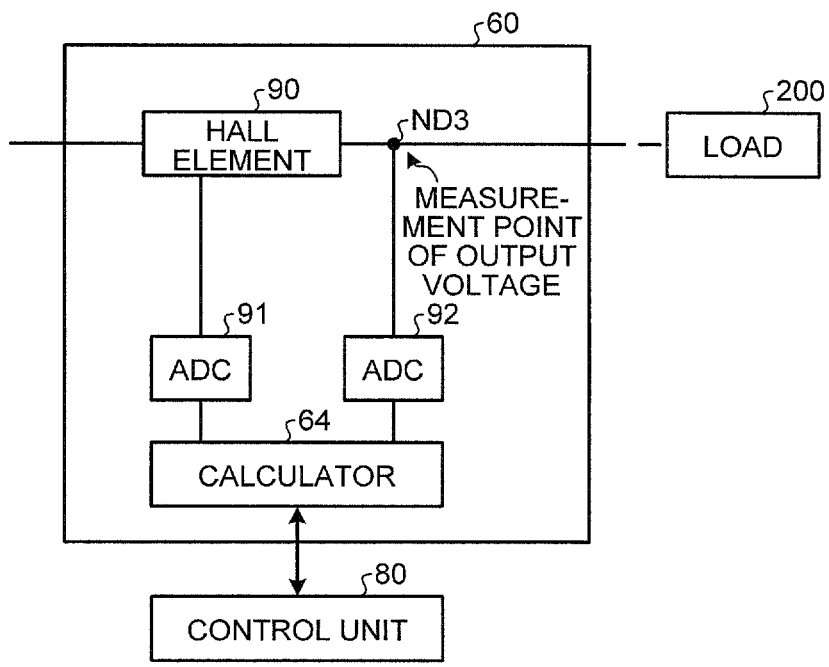
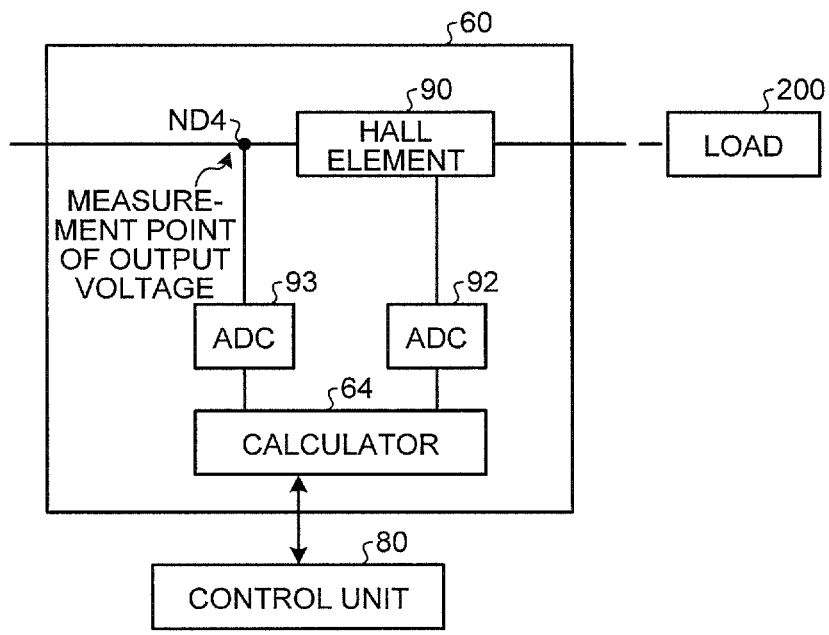

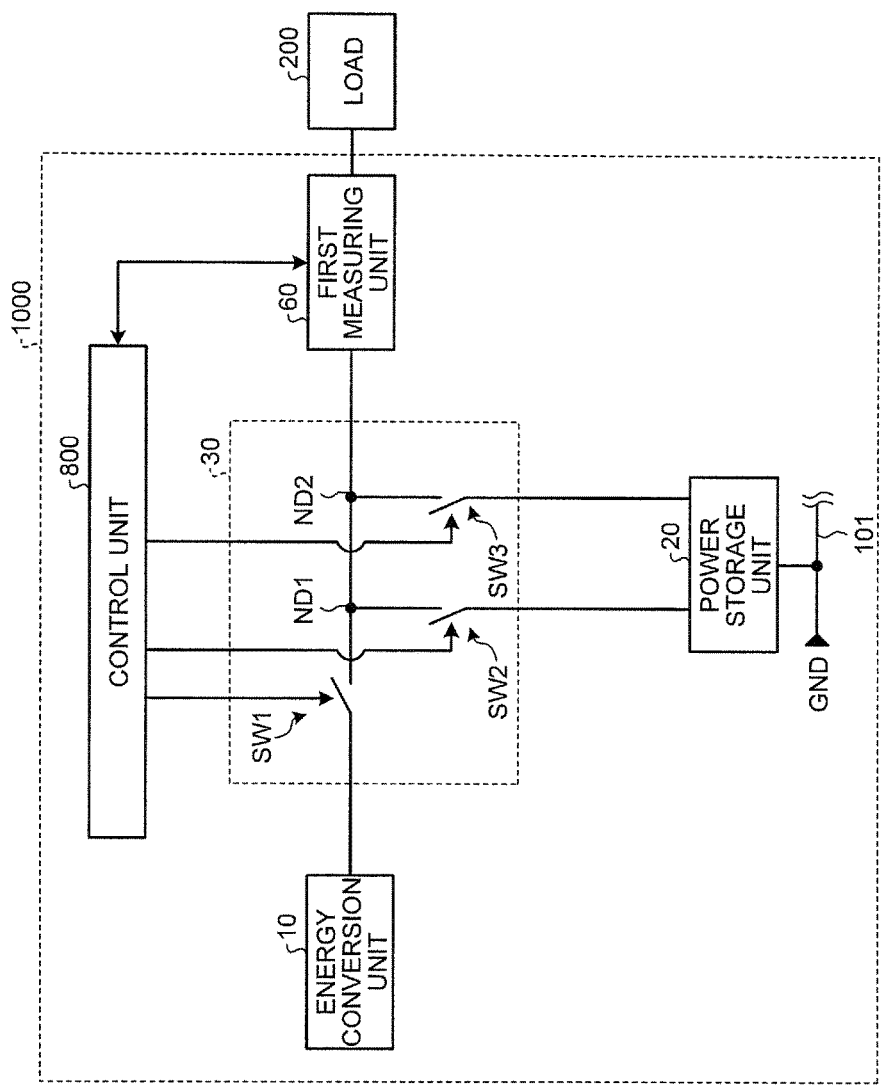

POWER SUPPLY SYSTEM AND POWER SUPPLY CONTROLLER

CROSS-REFERENCE TO RELATED APPLICATION

This application is based upon and claims the benefit of priority from Japanese Patent Application No. 2012-205829, filed on Sep. 19, 2012; the entire contents of which are incorporated herein by reference.

FIELD

Embodiments described herein relate generally to a power supply system and a power supply controller.

BACKGROUND

A power supply system having an energy conversion unit converting energy, other than electricity, into electric power, and a capacitor has conventionally been known. There is a solar cell system having a solar cell and a capacitor, which are connected in parallel, as one example of the power supply system described above.

However, when the solar cell and the capacitor are connected in parallel, electric power from the one having high output voltage is fed to a load, regardless of a power supplying capability. Specifically, in the background art, a power supply source (solar cell, capacitor) to the load cannot explicitly be selected (in other words, the power supply source cannot appropriately be selected). Therefore, the load connected to the power supply system is limited to the one whose maximum consumption power is not more than the maximum generated power of the solar cell.

BRIEF DESCRIPTION OF THE DRAWINGS

FIG. 2 is a diagram illustrating an example of a configuration of a first measuring unit according to the first embodiment;

FIG. 3 is a diagram illustrating an example of a configuration of a first measuring unit according to a modification;

FIG. 6 is a diagram illustrating an example of a configuration of a first measuring unit according to a modification;

FIG. 7 is a diagram illustrating an example of a configuration of a first measuring unit according to a modification;

FIG. 25 is a diagram illustrating an example of a configuration of a power supply system according to a modification of the second embodiment.

DETAILED DESCRIPTION

According to an embodiment, a power supply system includes a power generation unit, a power storage unit, a changeover unit, a first measuring unit, a second measuring unit, and a control unit. The power storage unit is configured to store electric power generated by the power generation unit. The changeover unit is configured to make a changeover between a first state in which the power generation unit and a load are connected to feed the electric power generated by the power generation unit to the load and a second state in which the power generation unit and the load are not connected but the power storage unit and the load are connected to feed the electric power stored in the power storage unit to the load. The first measuring unit is configured to measure electric power fed to the load. The second measuring unit is configured to measure electric power fed from the power generation unit. The control unit is configured to perform control to make the changeover to the first state when a value obtained by subtracting a first value from a value of the electric power measured by the second measuring unit is not less than a value of the electric power measured by the first measuring unit. The control unit is configured to perform control to make the changeover to the second state when the value obtained by subtracting the first value from the value of the electric power measured by the second measuring unit is less than the value of the electric power measured by the first measuring unit.

Embodiments of a power supply system, a power supply controller, and a program according to the present invention will be described below in detail with reference to the accompanying drawings.

First Embodiment

Figure 1:
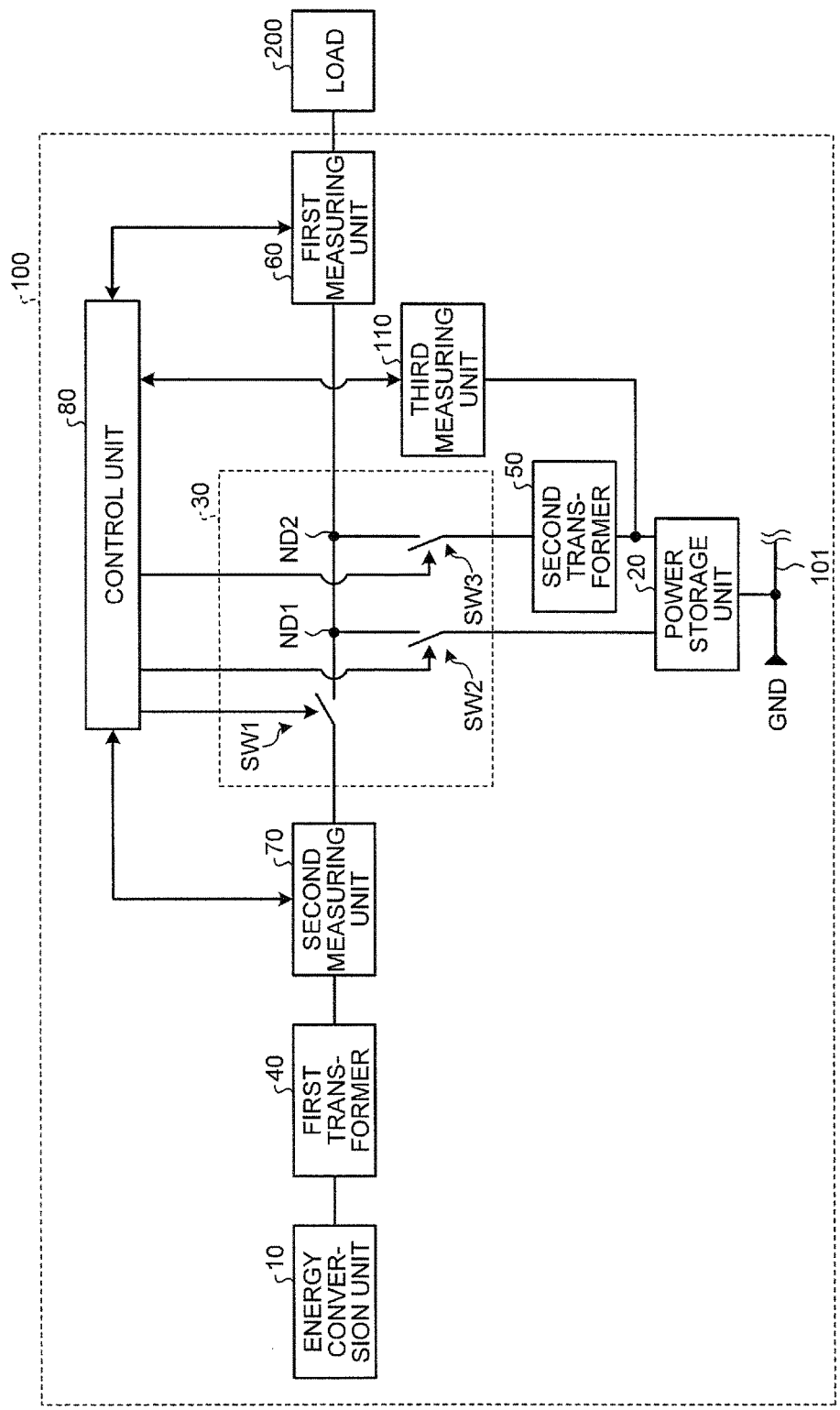
FIG. 1 is a diagram illustrating an example of a configuration of a power supply system according to a first embodiment.

FIG. 1 is a block diagram illustrating an example of a configuration of a power supply system 100 that feeds electric power to a load 200. As illustrated in FIG. 1, the power supply system 100 includes an energy conversion unit 10, a power storage unit 20, a changeover unit 30, a first transformer 40, a second transformer 50, a first measuring unit 60, a second measuring unit 70, a third measuring unit 110, and a control unit 80.

The energy conversion unit 10 converts energy, other than electricity, received from the outside of the power supply system 100 into electric power (electric energy). The energy conversion unit 10 includes a solar cell (solar panel), for example, but it is not limited thereto. In this embodiment, the energy conversion unit 10 may be referred to as a power generation unit.

The power storage unit 20 stores electric power converted in the energy conversion unit 10. In the present embodiment, the power storage unit 20 includes a capacitor. One electrode of the capacitor is connected to later-described second switch SW2 and third switch SW3, while the other electrode is connected to a power supply line 101 connected to a ground potential. The capacitor is a passive element that stores or discharges charges (electric energy). Examples of the capacitor used in the present embodiment include an electric double layer capacitor, a redox capacitor, and a hybrid capacitor (e.g., lithium ion capacitor) that employs an electric double layer on one of two electrodes, and employs a redox reaction (oxidation-reduction reaction) on the other electrode. Any capacitors can be used. The power storage unit 20 is not limited to the capacitor, so long as it can charge and discharge. Examples of usable power storage unit 20 include a lead storage battery, a lithium ion secondary battery, a lithium ion polymer secondary battery, a nickel-hydrogen storage cell, a nickel-cadmium storage cell, nickel-zinc storage cell, and a silver oxide-zinc storage cell.

The changeover unit 30 can make a changeover between a first state in which the energy conversion unit 10 and the load 200 are connected to feed the electric power converted by the energy conversion unit 10 to the load 200, and a second state in which the energy conversion unit 10 and the load are not connected, but the power storage unit 20 and the load 200 are connected to feed the electric power stored in the power storage unit 20 to the load 200. In the present embodiment, the changeover unit 30 includes a first switch SW1, a second switch SW2, and a third switch SW3.

The first switch SW1 is connected to the energy conversion unit 10 and the load 200 in series. When the first switch SW1 is turned on, a current path from the energy conversion unit 10 to the load 200 is formed (the energy conversion unit 10 and the load 200 are connected), so that electric power converted in the energy conversion unit 10 is fed to the load 200. The second switch SW2 and the third switch SW3 are arranged between the power storage unit 20 and the load 200. In the present embodiment, one end of the second switch SW2 is connected to one electrode of the capacitor which is the power storage unit 20, while the other end of the second switch SW2 is connected to a node ND1 on the current path from the first switch SW1 to the load 200. One end of the third switch SW3 is connected to one electrode of the capacitor, while the other end of the third switch SW3 is connected to a node ND2 between the node ND1 and the load 200.

The control unit 80 controls on/off of each of the first switch SW1, the second switch SW2, and the third switch SW3. Each of these switches can be configured by a bipolar transistor, a field-effect transistor, an insulated gate bipolar transistor, a grounded-trench-MOS assisted bipolar-mode FET, a phototransistor, a static induction transistor, a power bipolar transistor, a reverse conducting thyristor, a gate-assisted turn-off thyristor, a gate turn-off thyristor, a gate-commutated turn-off thyristor, a light-triggered thyristor, and a bidirectional thyristor.

The control unit 80 controls on/off of each of the first switch SW1, the second switch SW2, and the third switch SW3. In order to set the "first state" described above, the control unit 80 turns on the first switch SW1 and the second switch SW2, and turns off the third switch SW3. Thus, the energy conversion unit 10 and the load 200 are connected to bring the state (first state) in which electric power converted in the energy conversion unit 10 is fed to the load 200. In order to set the "second state" described above, the control unit 80 turns off the first switch SW1 and the second switch SW2, and turns on the third switch SW3 in the present embodiment. Thus, the energy conversion unit 10 and the load 200 are not connected, but the power storage unit 20 and the load 200 are connected to bring the state (second state) in which electric power stored in the power storage unit 20 is fed to the load 200.

The first transformer 40 transforms the output voltage from the energy conversion unit 10 into a predetermined voltage value. In the present embodiment, the first transformer 40 transforms the output voltage from the energy conversion unit 10 into a voltage (predetermined) needed by the load 200. The first transformer 40 can include a linear regulator or a switching regulator. There are a step-down regulator for stepping down an input voltage to an arbitrary voltage, a step-up regulator for stepping up the input voltage to an arbitrary voltage, and a step up/down regulator formed by combining these two types. Any regulators can be used. When electric power is extracted from a solar cell (one example of the energy conversion unit 10), the voltage required by the load 200 is lower than the output voltage from the solar cell. Therefore, a step-down regulator is often used for the first transformer 40.

The second transformer 50 transforms the output voltage from the power storage unit 20 into a predetermined voltage value. In the present embodiment, the second transformer 50 transforms the output voltage from the energy conversion unit 10 into a voltage (predetermined) needed by the load 200. Since the output voltage of a capacitor decreases with the discharge, a step-up regulator is preferably used for the second transformer 50. The configuration in which the step-up regulator is provided between the power storage unit 20 and the load 200 can solve the problem that electric power stored in the capacitor is not output, and many charges remain in the capacitor, because of the voltage drop caused by the discharge of the capacitor serving as the power storage unit 20.

The first measuring unit 60 measures the electric power fed to the load 200. In FIG. 1, the first measuring unit 60 is arranged between the changeover unit 30 (node ND2) and the load 200.

FIG. 2 is a diagram illustrating an example of the configuration of the first measuring unit 60. As illustrated in FIG. 2, the first measuring unit 60 includes a shunt resistance 61, an analog/digital converter (hereinafter referred to as "ADC") 62, an ADC 63, and a calculator 64. The shunt resistance 61 is arranged on a current path, not illustrated, from the second node ND2 to the load 200. The ADC 62 converts an analog value of a voltage of one terminal (the terminal close to the second node ND2) of the shunt resistance 61 into digital data. The ADC 63 converts an analog value of a voltage of the other terminal (the terminal close to the load 200) of the shunt resistance 61 into digital data. The calculator 64 measures electric power fed to the load 200, and reports the measurement result to the control unit 80, according to the request from the control unit 80. For example, the control unit 80 may periodically request the measurement of electric power to the calculator 64, or may request the measurement of electric power when some changes occur (e.g., when the condition of use of the load 200 changes). It may be configured such that, when some changes occur (e.g., when the measured value of electric power by the first measuring unit 60 exceeds a predetermined threshold value because the condition of use of the load 200 changes), the first measuring unit 60 reports the result to the control unit 80. The later-described changeover process may be started at the timing of receiving the report from the first measuring unit 60 (by using the report from the first measuring unit 60 as a trigger).

The measuring method of the first measuring unit 60 will be described in detail. The calculator 64 acquires the digital data converted by the ADC 62 and the digital data converted by the ADC 63, and acquires the voltage difference between the terminals of the shunt resistance 61 from the difference between the acquired digital data. The calculator 64 divides the voltage difference between the terminals of the shunt resistance 61 by the predetermined resistance value of the shunt resistance 61, thereby calculating a value of current flowing through the shunt resistance 61. The calculator 64 specifies the value acquired from the ADC 62 or the ADC 63 as the output voltage, and obtains the value of the electric power fed to the load 200 by multiplying the output voltage by the calculated current value.

For example, the first measuring unit 60 may include a storage unit 65 for storing the calculation result (measuring result) by the calculator 64 as illustrated in FIG. 3. In this case, the calculator 64 may periodically calculate the electric power fed to the load 200, and write the calculation result to the storage unit 65. In this configuration, the calculation result stored in the storage unit 65 is updated every time the calculator 64 makes the calculation. The control unit 80 can read the value stored in the storage unit 65 according to need. For example, the control unit 80 can periodically read the value stored in the storage unit 65, or can read the value stored in the storage unit 65 when some changes occur.

Figure 4:
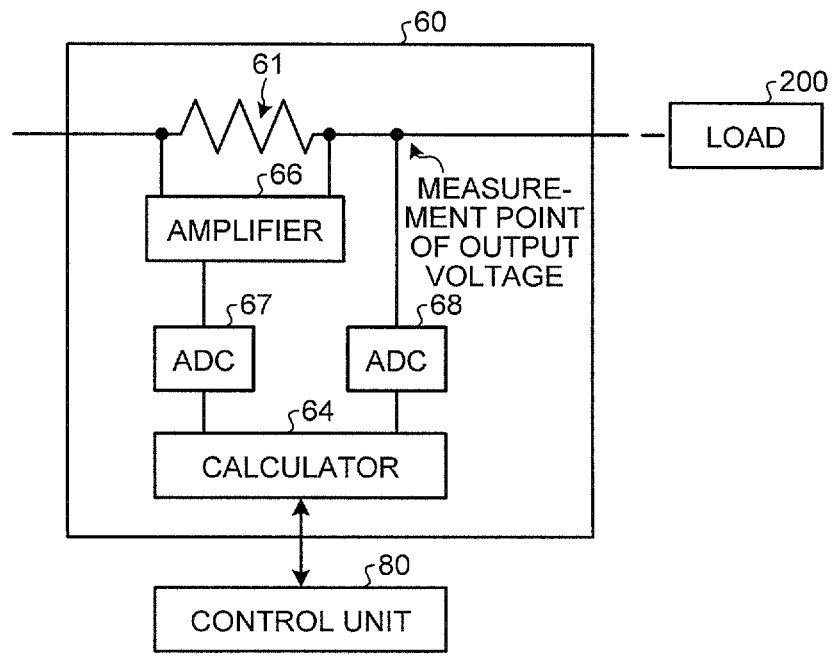
FIG. 4 is a diagram illustrating an example of a configuration of a first measuring unit according to a modification.

As illustrated in FIG. 4, the first measuring unit 60 may include an amplifier 66 for amplifying the voltage difference between both terminals of the shunt resistance 61, for example. Since the resistance value of the shunt resistance 61 is small, the voltage difference (the voltage difference between both terminals of the shunt resistance 61) generated on the shunt resistance 61 inevitably becomes very small. Since the resolution of the ADC is finite, there is a possibility of the voltage difference being regarded as zero by the round-off of the value with a quantization error. This concern is avoided by amplifying the voltage difference between both terminals of the shunt resistance 61 by the amplifier 66. In the example in FIG. 4, the first measuring unit 60 includes an ADC 67 that converts the analog value of the voltage difference amplified by the amplifier 66 into digital data, and an ADC 68 that converts the analog value of the voltage on the other terminal (the terminal close to the load 200) of the shunt resistance 61 into digital data. The calculator 64 acquires the digital data converted by the ADC 67, and obtains the value of current flowing through the shunt resistance 61 by dividing the acquired digital data by the predetermined resistance value of the shunt resistance 61, according to the request from the control unit 80. The calculator 64 acquires the digital data converted by the ADC 68 as the output voltage, and obtains the value of the electric power fed to the load 200 by multiplying the acquired output voltage by the calculated current value. When the amplifier 66 is inserted as in the example in FIG. 4, the value after the AD conversion becomes the value amplified by the amplifier 66. Therefore, the correct current value is the value obtained by dividing by the gain of the amplifier 66. Accordingly, when the value of current flowing through the shunt resistance 61 is obtained, or when the value of electric power fed to the load 200 is obtained, the calculator 64 makes division by the gain of the amplifier 66. Even in another example using the amplifier, the division by the gain of the amplifier 66 is necessary in order to acquire the correct measured value. As illustrated in FIG. 3, the storage unit 65 for storing the calculation result by the calculator 64 may be provided, for example.

Figure 5:
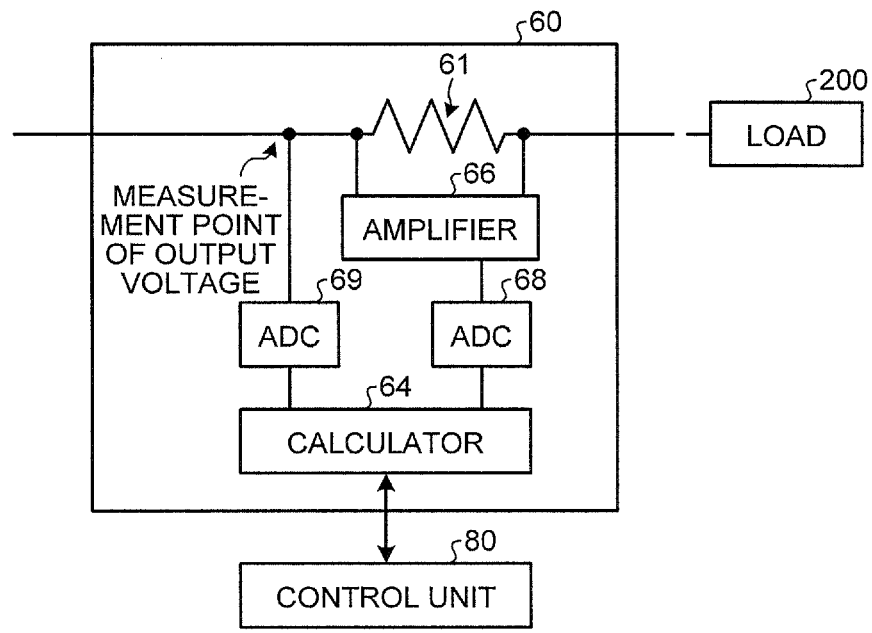
FIG. 5 is a diagram illustrating an example of a configuration of a first measuring unit according to a modification.

In the example in FIG. 4, the voltage on the other terminal (the terminal close to the load 200) of the shunt resistance 61 is used as the output voltage for calculating the electric power. However, as illustrated in FIG. 5, the voltage on one terminal (the terminal close to the second node ND2) of the shunt resistance 61 may be used as the output voltage for calculating the electric power. In the example in FIG. 5, an ADC 69 that converts the analog value of the voltage on one terminal of the shunt resistance 61 into digital data is provided instead of the ADC 68 in FIG. 4. The other configuration is the same as that in FIG. 4.

As illustrated in FIG. 6, the first measuring unit 60 may include a Hall element 90 instead of the shunt resistance 61. The Hall element 90 employs Hall effect as its principle, and outputs a voltage proportion to the value of the current flowing through the element. Therefore, the value of the current flowing through the Hall element 90 can be calculated from a characteristic table indicating the relationship between the current value and the voltage value. In the example in FIG. 6, the first measuring unit 60 includes an ADC 91 that converts the analog value of the output voltage of the Hall element 90 into digital data, and an ADC 92 that converts the analog value of the voltage on a node ND3 on the current path from the Hall element 90 to the load 200 into digital data. The calculator 64 acquires the digital data converted by the ADC 91, and obtains the current value (the value of current flowing through the Hall element 90) corresponding to the voltage value indicated by the acquired digital data from a characteristic table prepared beforehand (for example, this table may be stored in a memory not illustrated), according to the request from the control unit 80. The calculator 64 acquires the digital data converted by the ADC 92 as the output voltage, and obtains the value of the electric power fed to the load 200 by multiplying the acquired output voltage by the calculated current value.

In the example in FIG. 6, the voltage on the node ND3 on the current path from the Hall element 90 to the load 200 is used as the output voltage for calculating electric power. However, the voltage on a node ND4 on the current path from the second node ND2 (not illustrated) to the Hall element 90 may be used as the output voltage for calculating the electric power as illustrated in FIG. 7, for example. In the example in FIG. 7, an ADC 93 that converts the analog value of the voltage on the node ND4 into digital data is provided instead of the ADC 92 in FIG. 6. The other configuration is the same as that in FIG. 6.

Figure 8:
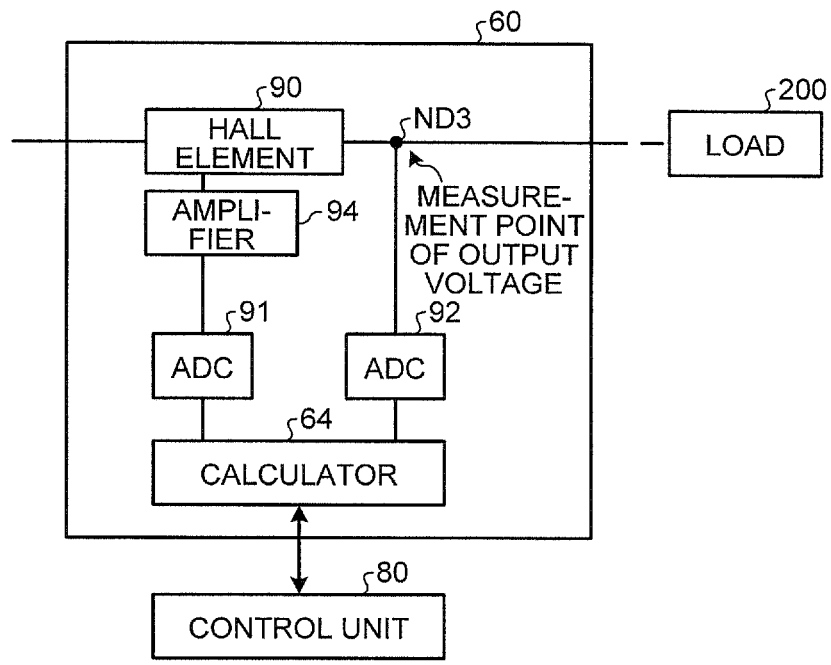
FIG. 8 is a diagram illustrating an example of a configuration of a first measuring unit according to a modification.

Since the voltage output from the Hall element 90 is very small, an amplifier 94 for amplifying the output voltage of the Hall element 90 may be provided between the Hall element 90 and the ADC 91 as illustrated in FIG. 8.

The description is continued referring back to FIG. 1. The second measuring unit 70 measures the electric power fed from the energy conversion unit 10. In the example in FIG. 1, the second measuring unit 70 is arranged between the first transformer 40 and the changeover unit 30. The configuration of the second measuring unit 70 is the same as that of the first measuring unit 60.

Figure 9:
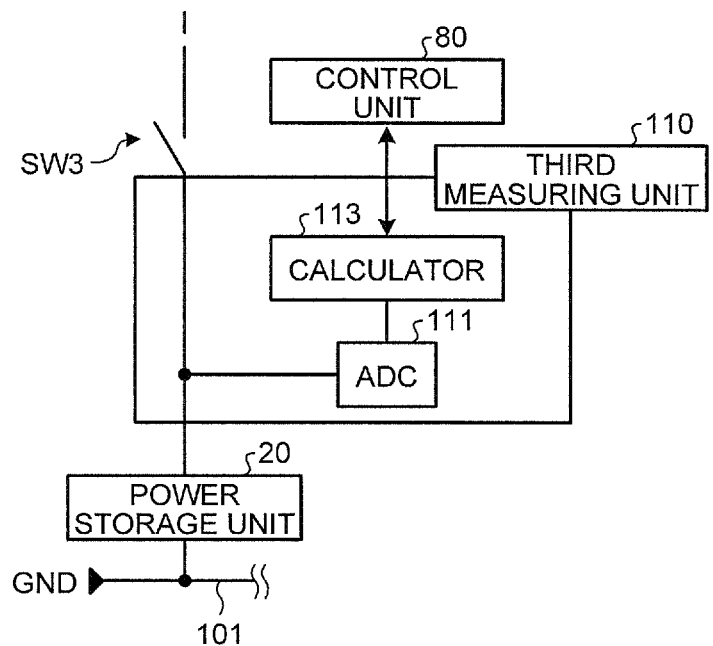
FIG. 9 is a diagram illustrating an example of a configuration of a third measuring unit according to the first embodiment.

The third measuring unit 110 measures the amount of charges (amount of stored power) stored in the power storage unit 20. FIG. 9 is a diagram illustrating an example of the configuration of the third measuring unit 110. As illustrated in FIG. 9, the third measuring unit 110 includes an ADC 111 and a calculator 113. The ADC 111 converts the analog value of the voltage on one electrode of the capacitor serving as the power storage unit 20 into digital data. In the example in FIG. 9, the other electrode of the capacitor is connected to the power supply line 101 connected to a ground potential. Therefore, the digital data converted by the ADC 111 represents the voltage (the voltage applied to the capacitor) between both electrodes of the capacitor. The calculator 113 measures the amount of stored power in the power storage unit 20, and reports the measurement result to the control unit 80, according to the request from the control unit 80. For example, the control unit 80 may periodically request the measurement of the amount of stored power to the calculator 113, or may request the measurement of the amount of stored power when some changes occur (e.g., when the condition of use of the load 200 changes).

The measuring method of the third measuring unit 110 will be described in detail. In the example in FIG. 9, the calculator 113 acquires the digital data converted by the ADC 111, and specifies the value of the voltage applied to the capacitor from the acquired digital data. The calculator 113 then obtains the amount of stored power of the capacitor by multiplying the predetermined capacitance of the capacitor by the specified voltage value ($Q=C \times V$).

Figure 10:
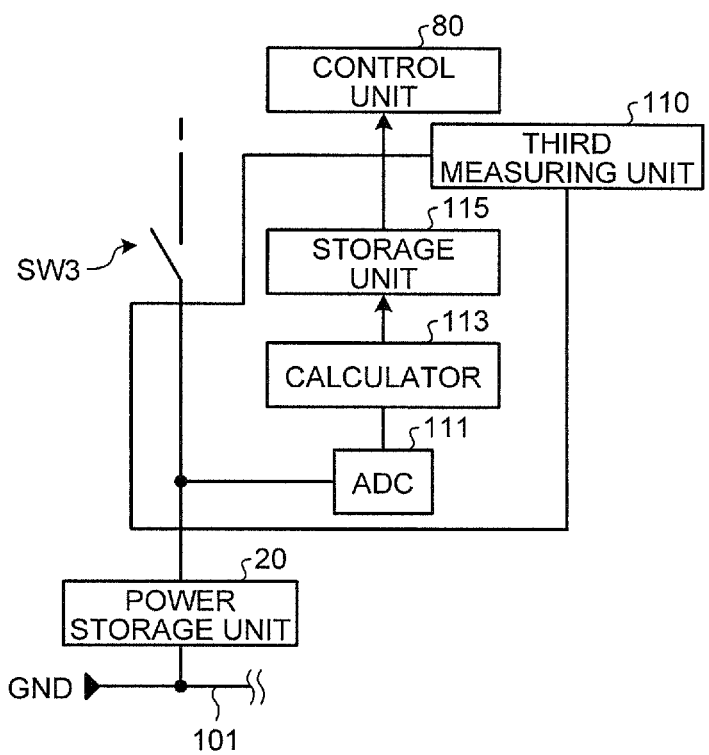
FIG. 10 is a diagram illustrating an example of a configuration of a third measuring unit according to a modification.

For example, the third measuring unit 110 may include a storage unit 115 for storing the calculation result (measuring result) by the calculator 113 as illustrated in FIG. 10. In this case, the calculator 113 may periodically calculate the amount of stored power in the power storage unit 20, and write the calculation result to the storage unit 115. In this configuration, the calculation result (measured amount of stored power) stored in the storage unit 115 is updated every time the calculator 113 makes the calculation. The control unit 80 can read the value stored in the storage unit 115 according to need. For example, the control unit 80 can periodically read the value stored in the storage unit 115, or can read the value stored in the storage unit 115 when some changes occur. The configuration of the third measuring unit 110 is not limited to the above-described configuration. Any device can be used, so long as it can measure the amount of stored power in the power storage unit 20. For example, a coulomb counter or a gas gauge can be used.

The description is continued referring back to FIG. 1. When the value obtained by subtracting a first value from the value of the electric power measured by the second measuring unit 70 is not less than the value of electric power measured by the first measuring unit 60, the control unit 80 performs the control to make the changeover to the first state. On the other hand, when the value obtained by subtracting the first value from the value of electric power measured by the second measuring unit 70 is less than the value of electric power measured by the first measuring unit 60, the control unit 80 performs the control to make the changeover to the second state. The present embodiment sets conditions in which the amount of stored power measured by the third measuring unit 110 is less than a first threshold value and the value obtained by subtracting the first value from the value of the electric power measured by the second measuring unit 70 is not less than the value of the electric power measured by the first measuring unit 60. When the conditions are satisfied, the control unit 80 makes the changeover to the first state. When the conditions are not satisfied, the control unit 80 makes the changeover to the second state. Specific details of the control unit 80 will be hereinafter described.

Figure 11:
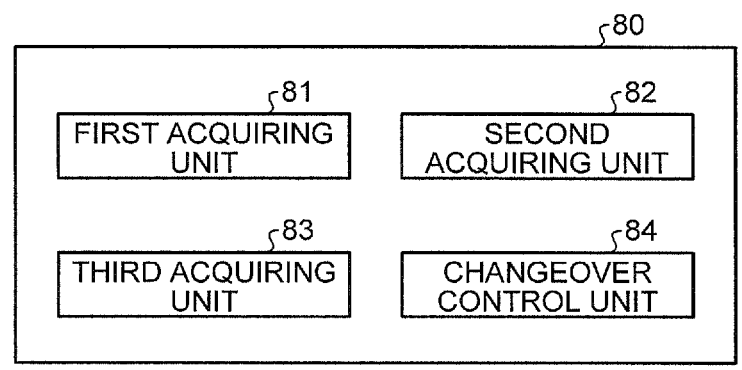
FIG. 11 is a diagram illustrating an example of a configuration of a control unit according to the first embodiment.

FIG. 11 is a block diagram illustrating an example of the configuration of the control unit 80. As illustrated in FIG. 11, the control unit 80 includes a first acquiring unit 81, a second acquiring unit 82, a third acquiring unit 83, and a changeover control unit 84.

The first acquiring unit 81 acquires the value of the electric power measured by the first measuring unit 60. For example, the first acquiring unit 81 can transmit to the first measuring unit 60 a signal requesting the measurement result of the electric power fed to the load 200, and receive the measurement result of the electric power in response to the signal. When the measurement result by the first measuring unit 60 is stored in the storage unit, the first acquiring unit 81 accesses to the storage unit to acquire the value stored in the storage unit.

The second acquiring unit 82 acquires the value of the electric power measured by the second measuring unit 70. For example, the second acquiring unit 82 can transmit to the second measuring unit 70 a signal requesting the measurement result of the electric power fed from the energy conversion unit 10, and receive the measurement result of the electric power fed from the energy conversion unit 10 in response to the signal. When the measurement result by the second measuring unit 70 is stored in the storage unit, the second acquiring unit 82 accesses to the storage unit to acquire the value stored in the storage unit.

The third acquiring unit 83 acquires the amount of stored power measured by the third measuring unit 110. For example, the third acquiring unit 83 can transmit to the third measuring unit 110 a signal requesting the measurement result of the amount of the stored power, and receive the measurement result of the amount of stored power in response to the signal. When the measurement result by the third measuring unit 110 is stored in the storage unit, the third acquiring unit 83 accesses to the storage unit to acquire the value stored in the storage unit.

The changeover control unit 84 controls the operation of the changeover unit 30. In the present embodiment, the changeover control unit 84 determines whether the amount of stored power acquired by the third acquiring unit 83 is not less than the first threshold value. When the amount of stored power acquired by the third acquiring unit 83 is not less than the first threshold value, the changeover control unit 84 determines that the conditions described above are not satisfied, thereby performing the control to make the changeover to the second state. Only when the amount of stored power acquired by the third acquiring unit 83 is less than the first threshold value, the value of the electric power acquired by the second acquiring unit 82 can be regarded as the electric power (generated power) obtained by the conversion in the energy conversion unit 10. The detailed reason will be described below. When the power storage unit 20 is not fully charged (or when the power storage unit 20 is not almost fully charged, e.g., when the amount of stored power is not less than the first threshold value), not only the electric power generated by the energy conversion unit 10 is fed to the load 200, but also the electric power (surplus power) obtained by subtracting the electric power fed to the load 200 from the electric power generated by the energy conversion unit 10 is fed to the power storage unit 20, since there is a voltage difference between the output voltage from the first transformer 40 and the voltage of the power storage unit 20. On the other hand, when the power storage unit 20 is fully charged, only the electric power needed by the load 200 is fed to the load 200 from the energy conversion unit 10. Specifically, when the power storage unit 20 is fully charged, the amount of generated power of the energy conversion unit 10 cannot be measured. When the power storage unit 20 is not fully charged, the measurement result by the second measuring unit 70 can be regarded as the amount of generated power from the energy conversion unit 10. Accordingly, the problem in which the generated power of the energy conversion unit 10 (the electric power obtained by the conversion by the energy conversion unit 10) cannot correctly be measured only by measuring the electric power fed from the energy conversion unit 10 can be solved as described below. The control unit 80 monitors the state of the power storage unit 20 by using the amount of stored power acquired by the third acquiring unit 83. Only when the amount of stored power is less than the first threshold value, the control unit 80 regards the value of the electric power acquired by the second acquiring unit 82 (the value of the electric power measured by the second measuring unit 70) as the generated power from the energy conversion unit 10, and when the amount of stored power is not less than the first threshold value, it makes a control to select the power storage unit 20, which can feed more electric power than the energy conversion unit 10, as the power supply source, since the generated power from the energy conversion unit 10 is uncertain.

On the other hand, when the amount of stored power acquired by the third acquiring unit 83 is less than the first threshold value, the changeover control unit 84 determines whether the value of the electric power acquired by the second acquiring unit 82 can cover the value of the electric power acquired by the first acquiring unit 81 (i.e., the value of the electric power fed to the load 200). When the amount of stored power of the power storage unit 20 is less than the first threshold value (when the power storage unit 20 has the capacity to store power), the electric power fed from the energy conversion unit 10 is distributed to the power storage unit 20 and the load 200 in the first state. In the present embodiment, the changeover control unit 84 compares the value obtained by subtracting the first value from the value of the electric power acquired by the second acquiring unit 82 and the value of the electric power acquired by the first acquiring unit 81. When the value obtained by subtracting the first value from the value of the electric power acquired by the second acquiring unit 82 is not less than the value of the electric power acquired by the first acquiring unit 81, the changeover control unit 84 determines that the electric power acquired by the second acquiring unit 82 can cover the electric power acquired by the first acquiring unit 81. In the present embodiment, the first value is supposed to be a fixed value, for example. However, the present embodiment is not limited thereto. The first value may dynamically change. For example, the first value may variably be set according to the value of the electric power fed from the energy conversion unit 10.

When the value obtained by subtracting the first value from the value of the electric power acquired by the second acquiring unit 82 is not less than the value of the electric power acquired by the first acquiring unit 81, the changeover control unit 84 determines that the condition is satisfied, and performs the control to make the changeover to the first state. More specifically, the changeover control unit 84 turns on the first switch SW1 and the second switch SW2, and turns off the third switch SW3. When the value obtained by subtracting the first value from the value of the electric power acquired by the second acquiring unit 82 is less than the value of the electric power acquired by the first acquiring unit 81, the changeover control unit 84 determines that the condition is not satisfied, and performs the control to make the changeover to the second state. More specifically, the changeover control unit 84 turns off the first switch SW1 and the second switch SW2, and turns on the third switch SW3.

The condition may be set to include only the case in which the value obtained by subtracting the first value from the value of the electric power acquired by the second acquiring unit 82 is not less than the value of the electric power acquired by the first acquiring unit 81. In this case, when the changeover control unit 84 determines that the value obtained by subtracting the first value from the value of the electric power acquired by the second acquiring unit 82 is not less than the value of the electric power acquired by the first acquiring unit 81, it may perform the control to make the changeover to the first state, regardless of the amount of stored power in the power storage unit 20. On the other hand, when the changeover control unit 84 determines that the value obtained by subtracting the first value from the value of the electric power acquired by the second acquiring unit 82 is less than the value of the electric power acquired by the first acquiring unit 81, it may perform the control to make the changeover to the second state, regardless of the amount of stored power in the power storage unit 20.

In the present embodiment, the control unit 80 is configured as a computer including a CPU (Central Processing Unit), a ROM, and a RAM. The function of each of the first acquiring unit 81, the second acquiring unit 82, the third acquiring unit 83, and the changeover control unit 84 can be realized by the CPU that expands and executes a program stored in, such as the ROM. The present embodiment is not limited thereto. For example, some of the functions of the first acquiring unit 81, the second acquiring unit 82, the third acquiring unit 83, and the changeover control unit 84 can be realized by a dedicated hardware circuit.

Figure 12:
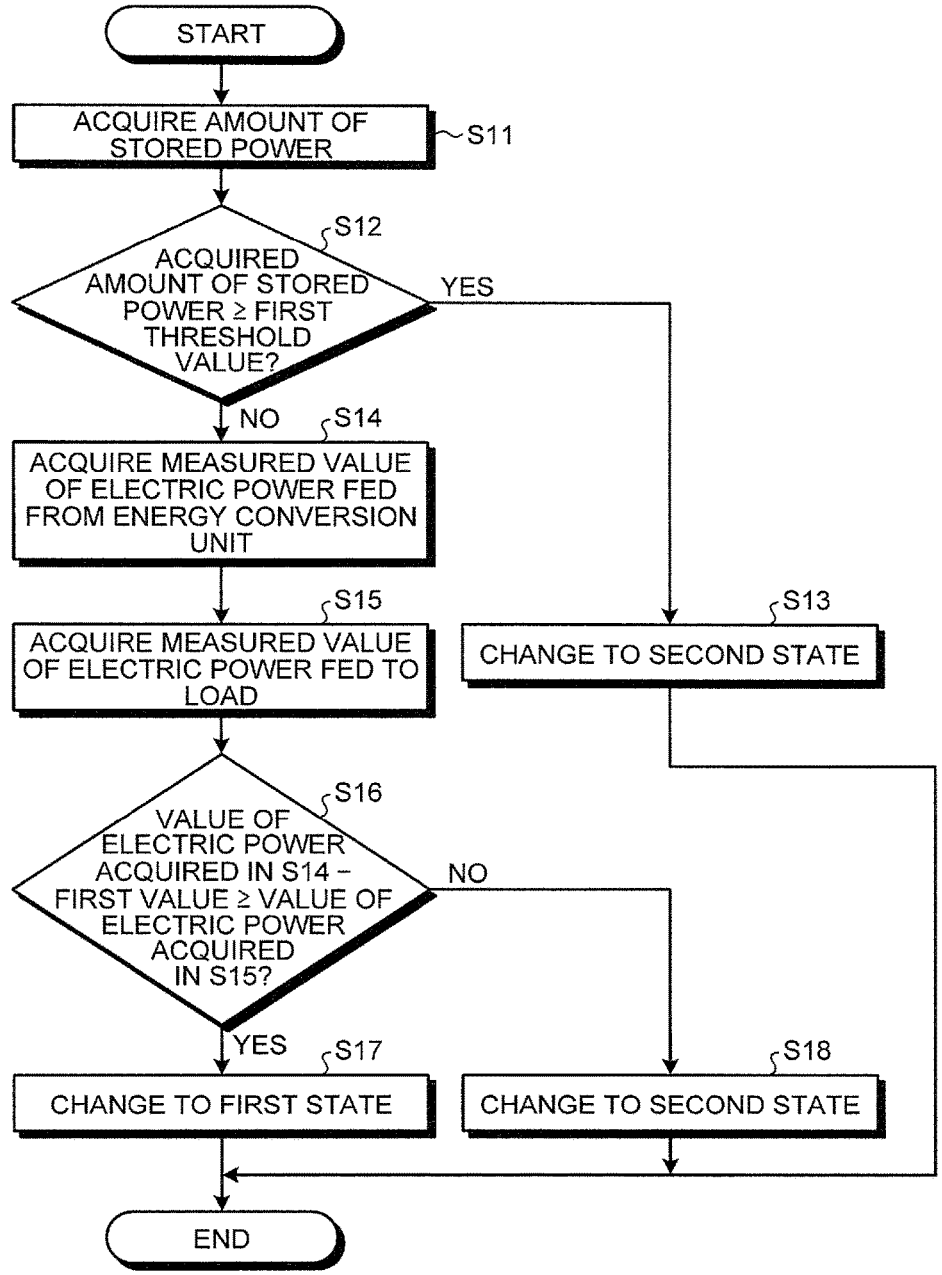
FIG. 12 is a flowchart illustrating one example of a changeover process according to the first embodiment.

The changeover process executed by the control unit 80 will be described next. FIG. 12 is a flowchart illustrating one example of the first changeover process executed by the control unit 80. In this example, it is supposed that the initial state (default state) of the power supply system 100 is set as the first state. As illustrated in FIG. 12, the third acquiring unit 83 firstly acquires the amount of stored power measured by the third measuring unit 110 (step S11). Then, the changeover control unit 84 determines whether the amount of stored power acquired in step S11 is not less than the first threshold value (step S12). When determining that the amount of stored power acquired in step S11 is not less than the first threshold value (result in step S12: YES), the changeover control unit 84 determines that the condition described above is not satisfied, and performs the control to make the changeover to the second state (step S13).

When determining that the amount of stored power acquired in step S11 is less than the first threshold value (result in step S12: NO), the changeover control unit 84 requests to the second acquiring unit 82 to acquire the measurement result by the second measuring unit 70. On receipt of this request, the second acquiring unit 82 acquires the value of the electric power measured by the second measuring unit 70 (the measured value of the electric power fed from the energy conversion unit 10) (step S14). Next, the changeover control unit 84 requests to the first acquiring unit 81 to acquire the measurement result by the first measuring unit 60. On receipt of this request, the first acquiring unit 81 acquires the electric power measured by the first measuring unit 60 (the measured value of the electric power fed to the load 200) (step S15). The order of step S14 and step S15 may be reversed.

Next, the changeover control unit 84 determines whether the value obtained by subtracting the first value from the value of the electric power acquired in step S14 is not less than the value of the electric power acquired in step S15 (step S16). When the value obtained by subtracting the first value from the value of the electric power acquired in step S14 is not less than the value of the electric power acquired in step S15 (result of step S16: YES), the changeover control unit 84 determines that the condition is satisfied, and performs the control to make the changeover to the first state (step S17). On the other hand, when the value obtained by subtracting the first value from the value of the electric power acquired in step S14 is less than the value of the electric power acquired in step S15 (result of step S16: NO), the changeover control unit 84 determines that the condition is not satisfied, and performs the control to make the changeover to the second state (step S18). This is the specific first changeover process (the first changeover process after the start) executed by the control unit 80.

Figure 13:
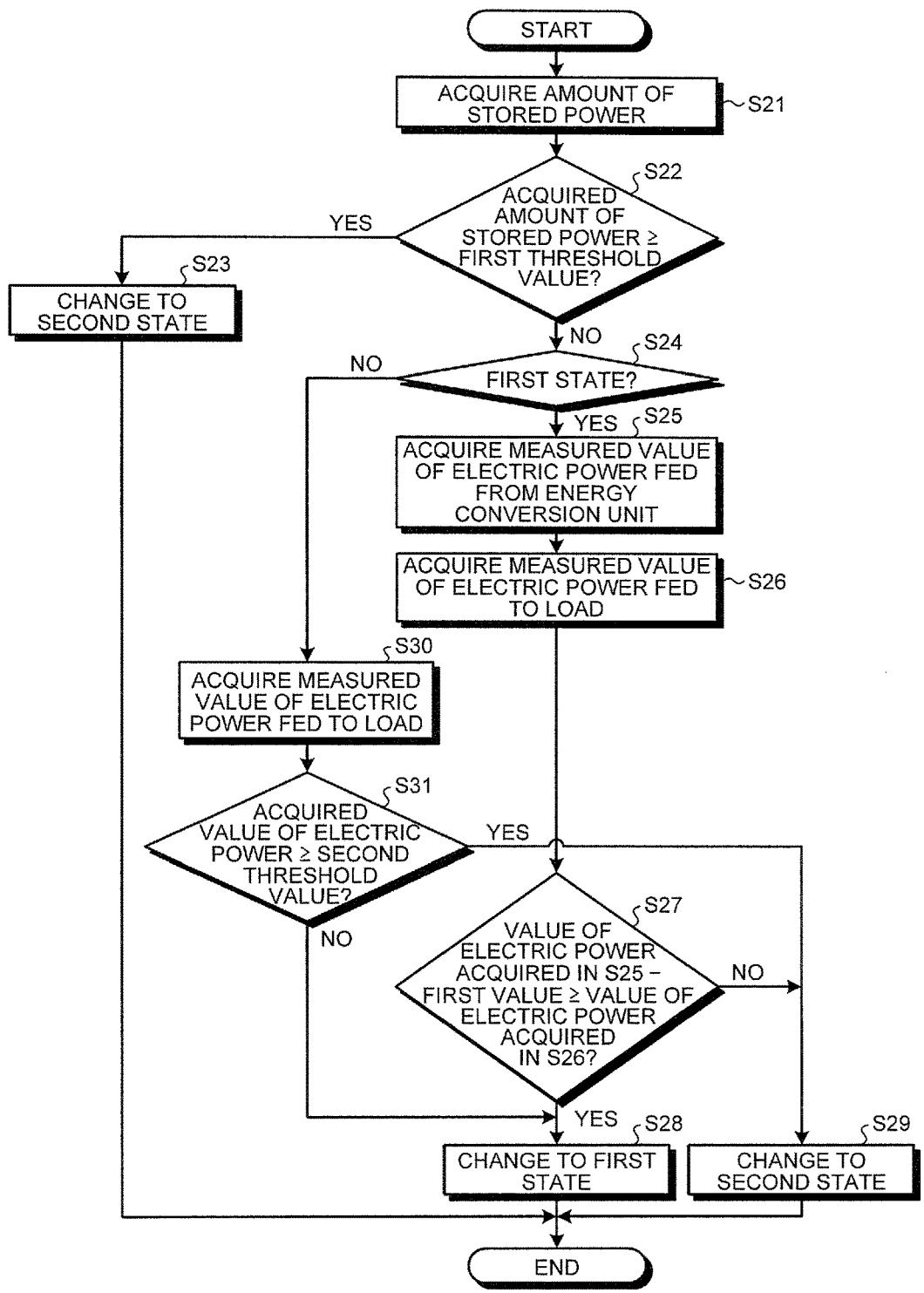
FIG. 13 is a flowchart illustrating one example of the changeover process according to the first embodiment.

FIG. 13 is a flowchart illustrating one example of the second and subsequent changeover process executed by the control unit 80. As illustrated in FIG. 12, the third acquiring unit 83 firstly acquires the amount of stored power measured by the third measuring unit 110 (step S21). Then, the changeover control unit 84 determines whether the amount of stored power acquired in step S21 is not less than the first threshold value (step S22). When determining that the amount of stored power acquired in step S21 is not less than the first threshold value (result in step S22: YES), the changeover control unit 84 determines that the condition described above is not satisfied, and performs the control to make the changeover to the second state (step S23).

When determining that the amount of stored power acquired in step S21 is less than the first threshold value in step S22 (result in step S22: NO), the changeover control unit 84 determines whether the current state of the power supply system 100 is the first state (step S24). When determining that the state of the current power supply system 100 is the first state (result of step S24: YES), the changeover control unit 84 requests to the second acquiring unit 82 to acquire the measurement result by the second measuring unit 70. On receipt of this request, the second acquiring unit 82 acquires the value of the electric power measured by the second measuring unit 70 (step S25). Next, the changeover control unit 84 requests to the first acquiring unit 81 to acquire the measurement result by the first measuring unit 60. On receipt of this request, the first acquiring unit 81 acquires the value of the electric power measured by the first measuring unit 60 (step S26). Next, the changeover control unit 84 determines whether the value obtained by subtracting the first value from the value of the electric power acquired in step S25 is not less than the value of the electric power acquired in step S26 (step S27). This process is the same as the process in step S16 in FIG. 12.

When the value obtained by subtracting the first value from the value of the electric power acquired in step S25 is not less than the value of the electric power acquired in step S26 in step S27 (result of step S27: YES), the changeover control unit 84 determines that the condition is satisfied, and performs the control to make the changeover to the first state (step S28). When the value obtained by subtracting the first value from the value of the electric power acquired in step S25 is less than the value of the electric power acquired in step S26 in step S27 (result of step S27: NO), the changeover control unit 84 determines that the condition is not satisfied, and performs the control to make the changeover to the second state (step S29).

On the other hand, when determining that the current state of the power supply system 100 is not the first state in step S24, i.e., when the current state is the second state (result of step S24: NO), the changeover control unit 84 requests to the first acquiring unit 81 to acquire the measurement result by the first measuring unit 60. On receipt of this request, the first acquiring unit 81 acquires the electric power measured by the first measuring unit 60 (the measured value of the electric power fed to the load 200) (step S30). Then, the changeover control unit 84 determines whether the value of the electric power acquired in step S30 is not less than a second threshold value (step S31). The detail of this process will be described in a later-described second embodiment. When determining that the value of the electric power acquired in step S30 is not less than the second threshold value (result of step S31: YES), the changeover control unit 84 determines that the condition described above is not satisfied, and performs the control to make the changeover to the second state (step S29). When determining that the value of the electric power acquired in step S30 is less than the second threshold value (result of step S31: NO), the changeover control unit 84 determines that the condition described above is satisfied, and performs the control to make the changeover to the first state (step S28). This is the specific second and subsequent changeover process executed by the control unit 80.

In the present embodiment, the initial state (default state) of the power supply system 100 is set to the first state. However, the present embodiment is not limited thereto. For example, the state of the power supply system 100 just before it is stopped may be set as the initial state of the power supply system 100 upon the start afterward. The changeover process in this case can be the one illustrated in the flowchart in FIG. 13, regardless of whether it is the first changeover process or the second and subsequent changeover process.

As described above, the power supply system 100 in the present embodiment includes the changeover unit 30 that changes the state of the power supply system to the first state in which the energy conversion unit 10 and the load 200 are connected to feed the electric power converted by the energy conversion unit 10 to the load 200, and to the second state in which the energy conversion unit 10 and the load 200 are not connected, but the power storage unit 20 and the load 200 are connected to feed the electric power stored in the power storage unit 20 to the load 200, and the control unit 80 that controls the operation of the changeover unit 30. When the conditions in which the amount of stored power of the power storage unit 20 (the value of the electric power measured by the third measuring unit 110) is less than the first threshold value and the value obtained by subtracting the first value from the value of the electric power fed from the energy conversion unit 10 (the value of the electric power measured by the second measuring unit 70) is not less than the value of the electric power fed to the load 200 (the value of the electric power measured by the first measuring unit 60) are satisfied, the control unit 80 performs the control to change the power supply system to the first state. When the conditions are not satisfied, the control unit 80 performs the control to change the power supply system to the second state.

For example, when the amount of stored power of the power storage unit 20 is not less than the first threshold value, the conditions in the present embodiment are not satisfied, so that the control unit 80 performs the control to make the changeover to the second state. When the amount of stored power of the power storage unit 20 is not less than the first threshold value, the power storage unit 20 can feed the electric power larger than the maximum electric power that can be converted by the energy conversion unit 10 to the load 200. In the second state, the energy conversion unit 10 and the load 200 are not connected, but the power storage unit 20 and the load 200 are connected. Therefore, even if the output voltage of the power storage unit 20 is lower than the output voltage of the energy conversion unit 10, the electric power stored in the power storage unit 20 can be fed to the load 200. Specifically, the power storage unit 20 can be selected as the power supply source without being dependent on the respective output voltages of the energy conversion unit 10 and the power storage unit 20. Therefore, the load 200 whose maximum consumption power exceeds the maximum electric power that can be converted by the energy conversion unit (e.g., solar cell) 10 can be operated.

For example, when the value obtained by subtracting the first value from the value of the electric power fed to the energy conversion unit 10 is less than the value of the electric power fed to the load 200, the conditions in the present embodiment are not satisfied. Therefore, the control unit 80 performs the control to make the changeover to the second state. Specifically, in this case, the control unit 80 determines that the power consumption of the load 200 cannot be covered by the electric power from the energy conversion unit 10, and selects the power storage unit 20 that can feed the electric power larger than the electric power from the energy conversion unit 10 as the power supply source. When the amount of stored power of the power storage unit 20 is less than the first threshold value, and the value obtained by subtracting the first value from the electric power fed from the energy conversion unit 10 is not less than the value of the electric power fed to the load 200, the conditions of the present embodiment are satisfied. Therefore, the control unit 80 performs the control to make the changeover to the first state. Specifically, in this case, the control unit 80 determines that the power consumption of the load 200 can be covered by the electric power from the energy conversion unit 10, and selects the energy conversion unit 10 as the power supply source. As described above, according to the present embodiment, an appropriate power supply source (energy conversion unit 10, power storage unit 20) can be selected as the power supply source without being dependent on the respective output voltages of the energy conversion unit 10 and the power storage unit 20. Therefore, the load 200 whose maximum consumption power exceeds the maximum electric power that can be converted by the energy conversion unit (e.g., solar cell) 10 can be operated.

Second Embodiment

Figure 14:
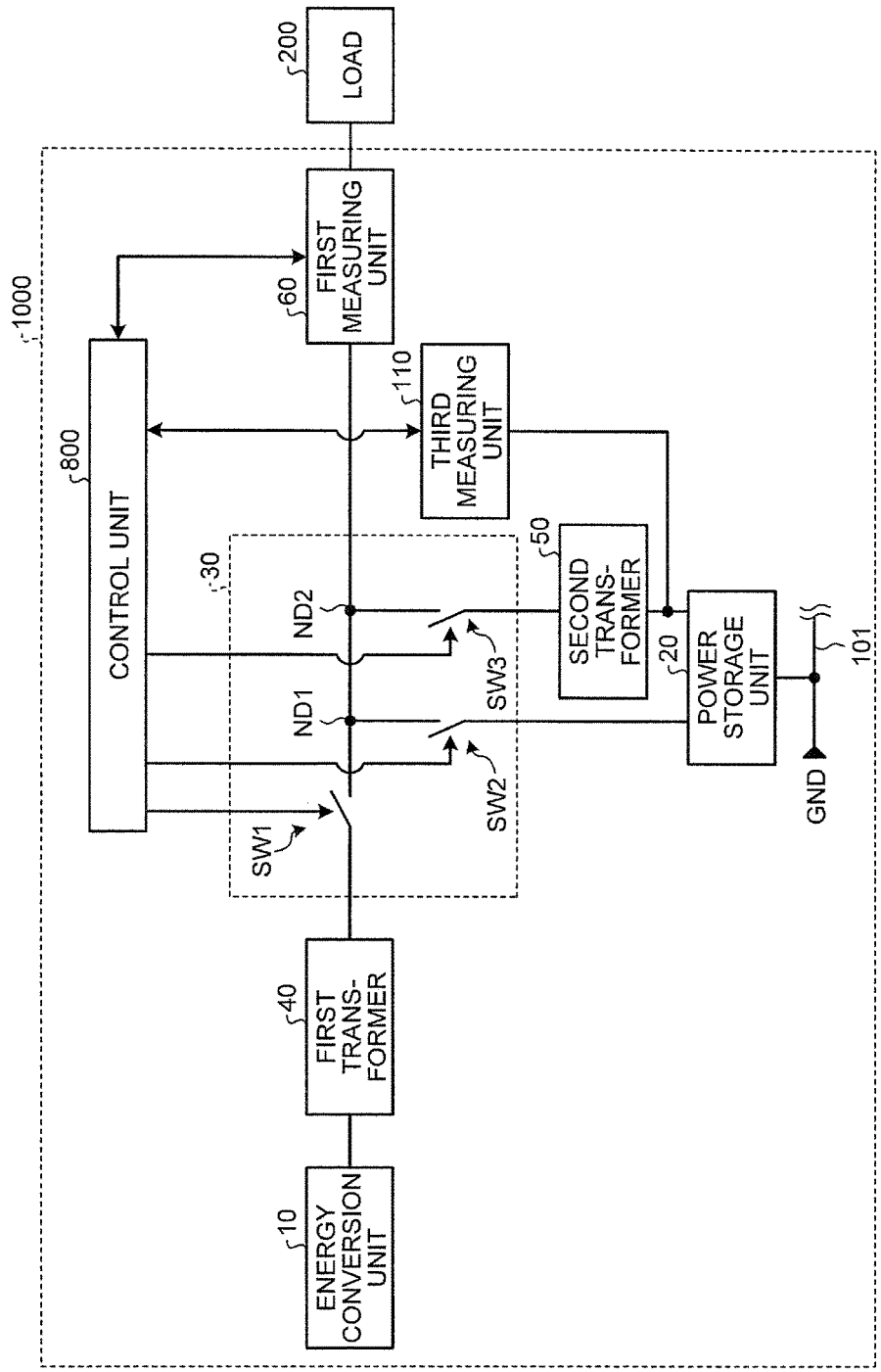
FIG. 14 is a diagram illustrating an example of a configuration of a power supply system according to a second embodiment.

FIG. 14 is a diagram illustrating an example of a configuration of a power supply system 1000 according to a second embodiment. In the power supply system 1000 in the second embodiment, the second measuring unit 70 described above is not provided, and a control unit 800 performs a control to make a changeover to the first state, when the value of the electric power measured by the first measuring unit 60 is less than the second threshold value, and performs the control to make a changeover to the second state, when the value of the electric power measured by the first measuring unit 60 is not less than the second threshold value. The detail will be described below more specifically.

Figure 15:
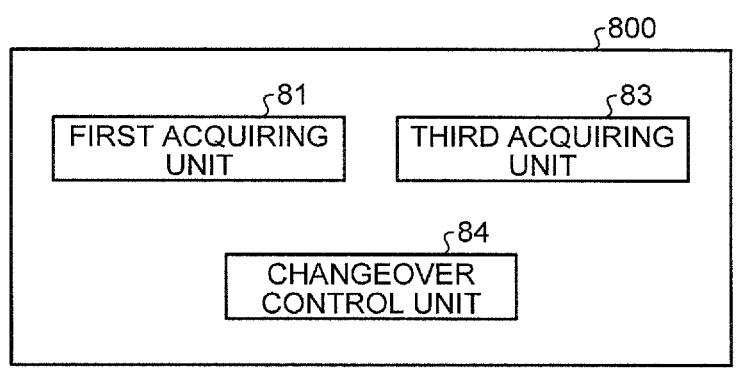
FIG. 15 is a diagram illustrating an example of a configuration of a control unit according to the second embodiment.

FIG. 15 is a block diagram illustrating an example of the configuration of the control unit 800. As illustrated in FIG. 15, the control unit 800 includes a first acquiring unit 81, a third acquiring unit 83, and a changeover control unit 84. In the present embodiment, the changeover control unit 84 determines whether the amount of stored power acquired by the third acquiring unit 83 is not less than the first threshold value. When the amount of stored power acquired by the third acquiring unit 83 is not less than the first threshold value, the changeover control unit 84 determines that the condition described above is not satisfied, thereby performing the control to make the changeover to the second state. On the other hand, when the amount of stored power acquired by the third acquiring unit 83 is less than the first threshold value, the changeover control unit 84 determines whether the value of the electric power acquired by the first acquiring unit 81 is not less than the second threshold value. When the value of the electric power acquired by the first acquiring unit 81 is not less than the second threshold value, the changeover control unit 84 determines that the condition is not satisfied, and performs the control to make the changeover to the second state. On the other hand, when the value of the electric power acquired by the first acquiring unit 81 is less than the second threshold value, the changeover control unit 84 determines that the condition is satisfied, and performs the control to make the changeover to the first state.

The condition may be set to include only the case in which the value acquired by the first acquiring unit 81 is less than the second threshold value. In this case, when the changeover control unit 84 determines that the value acquired by the first acquiring unit 81 is less than the second threshold value, it may perform the control to make the changeover to the first state, regardless of the amount of stored power in the power storage unit 20. On the other hand, when the changeover control unit 84 determines that the value obtained by the first acquiring unit 81 is not less than the second threshold value, it may perform the control to make the changeover to the second state, regardless of the amount of stored power in the power storage unit 20.

Figure 16:
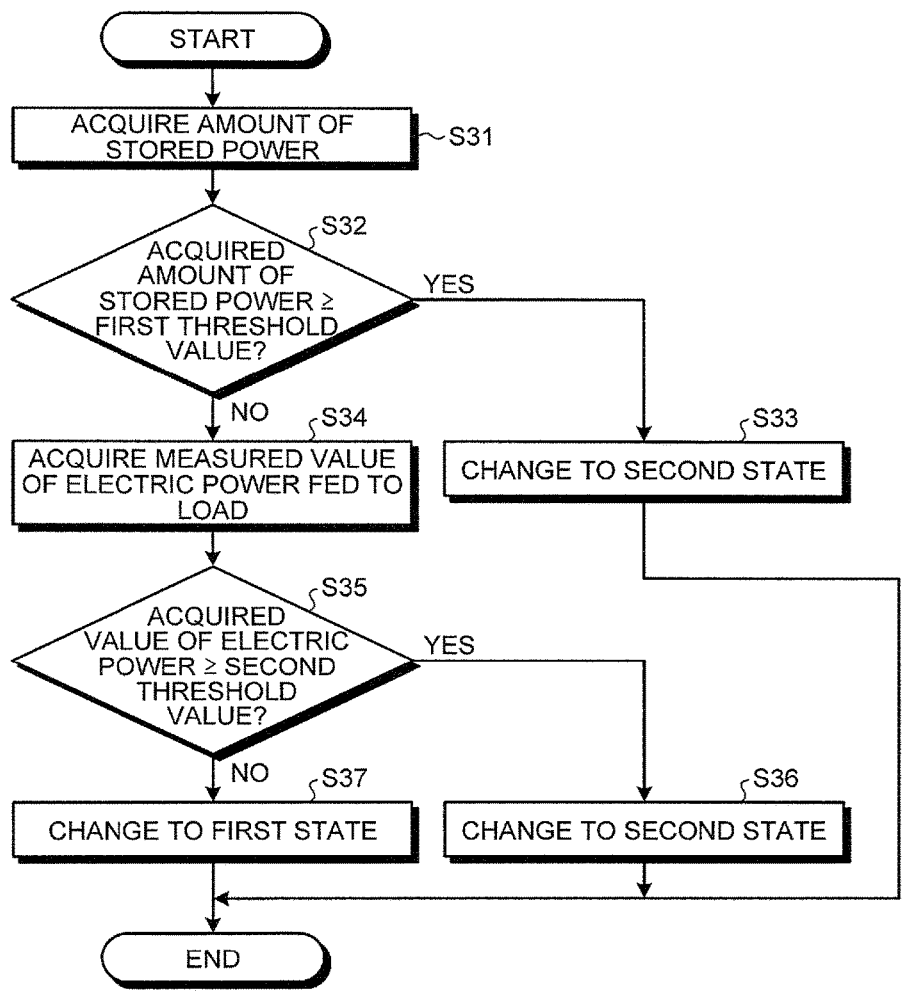
FIG. 16 is a flowchart illustrating one example of a changeover process according to the second embodiment.

The changeover process executed by the control unit 800 will be described next with reference to FIG. 16. FIG. 16 is a flowchart illustrating one example of the changeover process. As illustrated in FIG. 16, the third acquiring unit 83 firstly acquires the amount of stored power measured by the third measuring unit 110 (step S31). Then, the changeover control unit 84 determines whether the amount of stored power acquired in step S31 is not less than the first threshold value (step S32). When determining that the amount of stored power acquired in step S31 is not less than the first threshold value (result in step S32: YES), the changeover control unit 84 determines that the condition is not satisfied, and performs the control to make the changeover to the second state (step S33). More specifically, the changeover control unit 84 turns off the first switch SW1 and the second switch SW2, and turns on the third switch SW3. Thus, the power supply system is in the second state in which the energy conversion unit 10 and the load 200 are not connected, but the power storage unit 20 and the load 200 are connected to feed the electric power stored in the power storage unit 20 to the load 200.

On the other hand, when determining that the amount of stored power acquired in step S31 is less than the first threshold value (result in step S32: NO), the changeover control unit 84 requests to the first acquiring unit 81 to acquire the measurement result by the first measuring unit 60. On receipt of this request, the first acquiring unit 81 acquires the electric power measured by the first measuring unit 60 (the measured value of the electric power fed to the load 200) (step S34). Then, the changeover control unit 84 determines whether the value of the electric power acquired in step S34 is not less than a second threshold value (step S35). When determining that the amount of stored power acquired in step S34 is not less than the second threshold value (result in step S35: YES), the changeover control unit 84 determines that the condition is not satisfied, and performs the control to make the changeover to the second state (step S36).

When determining that the value of the electric power acquired in step S34 is less than the second threshold value (result of step S35: NO) in step S35, the changeover control unit 84 determines that the condition described above is satisfied, and performs the control to make the changeover to the first state (step S37). More specifically, the changeover control unit 84 turns on the first switch SW1 and the second switch SW2, and turns off the third switch SW3. Thus, the power supply system is in the state (first state) in which the energy conversion unit 10 and the load 200 are connected to feed the electric power converted by the energy conversion unit 10 to the load 200.

The control unit 800 repeatedly executes the changeover process described above. A periodic interruption by a timer, or the detection of the change in the state of the load 200 can be used as a trigger (timing) of repeating the changeover process.

As described above, when the conditions indicating that the amount of stored power in the power storage unit 20 is less than the first threshold value, and the value of the electric power fed to the load 200 (the value of the electric power measured by the first measuring unit 60, i.e., the value of the electric power acquired by the first acquiring unit 81) is less than the second threshold value are satisfied, the control unit 800 according to the present embodiment performs the control to make the changeover to the first state. On the other hand, when the conditions described above are not satisfied, the control unit 800 performs the control to make the changeover to the second state.

For example, when the amount of stored power in the power storage unit 20 is not less than the first threshold value, the conditions in the present embodiment are not satisfied, so that the control unit 800 performs the control to make the changeover to the second state. When the amount of stored power in the power storage unit 20 is not less than the first threshold value, the power storage unit 20 can feed the electric power larger than the maximum electric power that can be converted by the energy conversion unit 10 to the load 200. In the second state, the energy conversion unit 10 and the load 200 are not connected, but the power storage unit 20 and the load 200 are connected. Therefore, even if the output voltage of the power storage unit 20 is lower than the output voltage of the energy conversion unit 10, the electric power stored in the power storage unit 20 can be fed to the load 200. Specifically, the power storage unit 20 can be selected as the power supply source without being dependent on the respective output voltages of the energy conversion unit 10 and the power storage unit 20. Therefore, the load 200 whose maximum consumption power exceeds the maximum electric power that can be converted by the energy conversion unit (e.g., solar cell) 10 can be operated.

For example, when the value of the electric power fed to the load 200 is not less than the second threshold value, the conditions in the present embodiment are not satisfied, so that the control unit 80 performs the control to make the changeover to the second state. Specifically, in this case, the control unit 800 determines that the power consumption of the load 200 cannot be covered by the electric power from the energy conversion unit 10, and selects the power storage unit 20 that can feed the electric power larger than the electric power from the energy conversion unit 10 as the power supply source. When the amount of stored power in the power storage unit 20 is less than the first threshold value, and the value of the electric power fed to the load 200 is less than the second threshold value, the conditions of the present embodiment are satisfied. Therefore, the control unit 80 performs the control to make the changeover to the first state. Specifically, in this case, the control unit 800 determines that the power consumption of the load 200 can be covered by the electric power from the energy conversion unit 10, and selects the energy conversion unit 10 as the power supply source. As described above, according to the present embodiment, an appropriate power supply source (energy conversion unit 10, power storage unit 20) can be selected as the power supply source without being dependent on the respective output voltages of the energy conversion unit 10 and the power storage unit 20. Therefore, the load 200 whose maximum consumption power exceeds the maximum electric power that can be converted by the energy conversion unit (e.g., solar cell) 10 can be operated.

Modifications will be described below. The embodiments described above and the modifications described below can be combined to one another.

Modification 1

In the second embodiment described above, the power supply source (energy conversion unit 10, power storage unit 20) of the load 200 is selected by using the value of the electric power measured by the first measuring unit 60. However, the invention is not limited thereto. The power supply source may be selected by using a value of current fed to the load 200, for example. In this case, the first measuring unit 60 (calculator 64) may not make the calculation of the value of the electric power fed to the load 200, but may calculate only the value of current flowing through the shunt resistance 61 by dividing the voltage difference between the terminals of the shunt resistance 61 by the predetermined resistance value of the shunt resistance 61. In this case, the first measuring unit 60 functions as a current measuring unit that measures current fed to the load 200. In summary, it may be configured to include a current measuring unit that measures current fed to the load 200. In this modification, the control unit 800 includes a current value acquiring unit that acquires the current value measured by the current measuring unit, and the changeover control unit 84 performs the control to make the changeover to the first state, when the amount of stored power acquired by the third acquiring unit 83 is less than the first threshold value, and the current value acquired by the current value acquiring unit is less than a third threshold value. On the other hand, when the conditions in which the amount of stored power acquired by the third acquiring unit 83 is less than the first threshold value and the current value acquired by the current value acquiring unit is less than the third threshold value are not satisfied, the changeover control unit 84 performs the control to make the changeover to the second state. When the current value acquired by the current value acquiring unit is less than the third threshold value, the changeover control unit 84 performs the control to make the changeover to the first state, regardless of the amount of stored power in the power storage unit 20, and when the current value acquired by the current value acquiring unit is not less than the third threshold value, the changeover control unit 84 performs the control to make the changeover to the second state, regardless of the amount of stored power in the power storage unit 20.

Modification 2

In the first embodiment described above, the power supply source (energy conversion unit 10, power storage unit 20) of the load 200 is selected by using the value of the electric power measured by the first measuring unit 60 and the value of the electric power measured by the second measuring unit 70. Since the output voltage from the first transformer 40 and the output voltage from the second transformer 50 are the same in the above embodiment, it may be configured such that the power supply source may be selected by using the current value. In this case, the first measuring unit 60 may not make the calculation of the value of the electric power fed to the load 200, but may calculate only the value of current flowing through the shunt resistance 61 by dividing the voltage difference between the terminals of the shunt resistance 61 by the predetermined resistance value of the shunt resistance 61. In this case, the first measuring unit 60 functions as a current measuring unit that measures current fed to the load 200. Similarly, the second measuring unit 70 may not make the calculation of the value of the electric power fed from the energy conversion unit 10, but may calculate only the value of current flowing through the shunt resistance, arranged between the energy conversion unit 10 (the first transformer 40) and the changeover unit 30, by dividing the voltage difference between the terminals of the shunt resistance by the predetermined resistance value of the shunt resistance. In this case, the second measuring unit 70 functions as a current value measuring unit that measures current output from the energy conversion unit 10.

In summary, it may be configured to include a first current measuring unit that measures the current output from the energy conversion unit 10, and a second current measuring unit that measures the current fed to the load 200. In this example, the control unit includes a first current value acquiring unit that acquires the current value measured by the first current measuring unit, and a second current value acquiring unit that acquires the current value measured by the second current measuring unit, and the changeover control unit can perform the control to make the changeover to the first state, when the amount of stored power acquired by the third acquiring unit 83 is less than the first threshold value, and a value obtained by subtracting a second value (fixed value or dynamically changed value) from the current value acquired by the first current value acquiring unit is not less than the current value acquired by the second current value acquiring unit. On the other hand, when the amount of stored power acquired by the third acquiring unit 83 is less than the first threshold value, and the value obtained by subtracting the predetermined value from the current value acquired by the first current value acquiring unit is less than the current value acquired by the second current value acquiring unit, the changeover control unit 84 can perform the control to make the changeover to the second state. When the value obtained by subtracting the predetermined value from the current value acquired by the first current value acquiring unit is not less than the current value acquired by the second current value acquiring unit, the changeover control unit 84 can perform the control to make the changeover to the first state, regardless of the amount of stored power in the power storage unit 20. On the other hand, when the value obtained by subtracting the predetermined value from the current value acquired by the first current value acquiring unit is less than the current value acquired by the second current value acquiring unit, the changeover control unit 84 can perform the control to make the changeover to the second state, regardless of the amount of stored power in the power storage unit 20.

Modification 3

Figure 17:
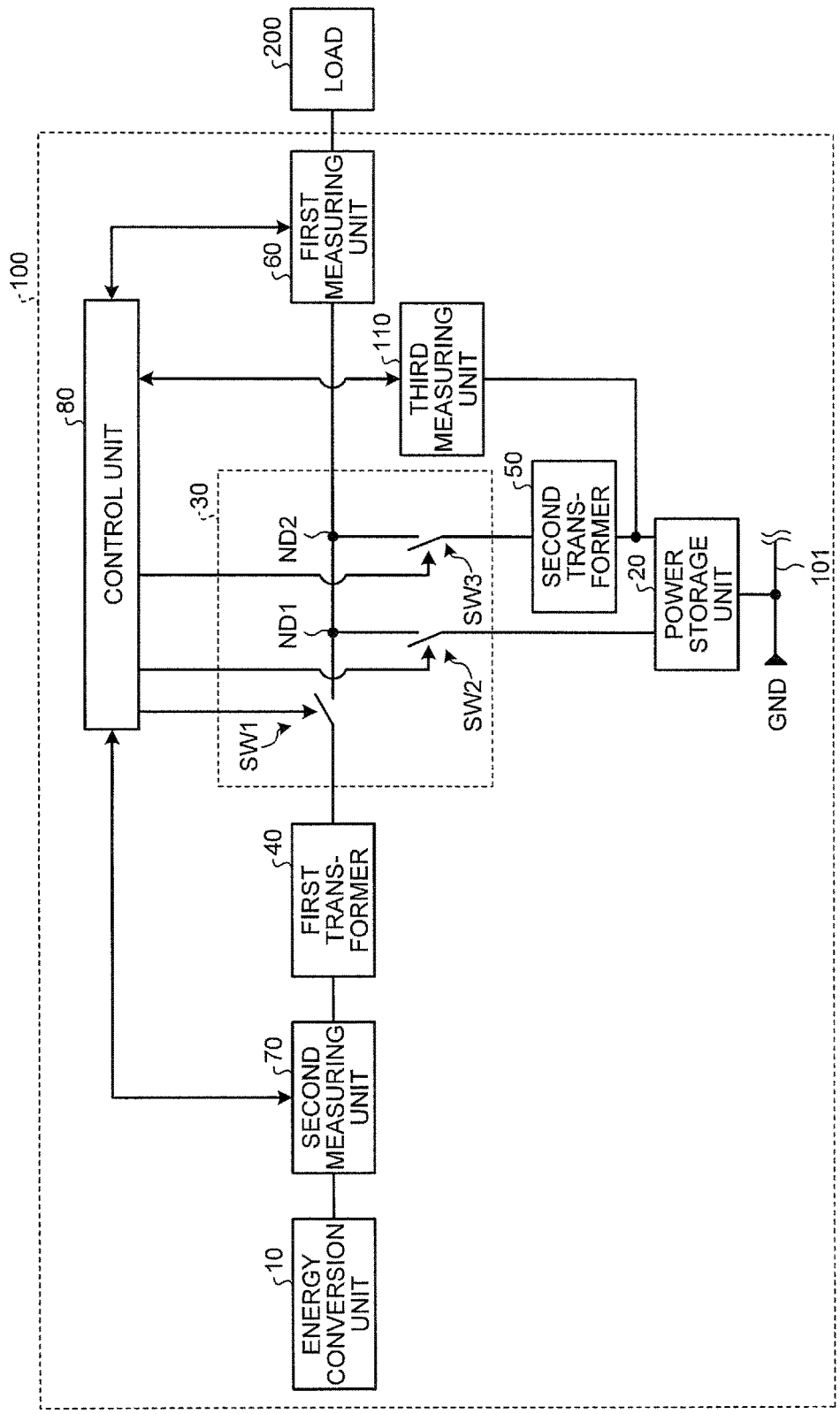
FIG. 17 is a diagram illustrating an example of a configuration of a power supply system according to a modification.

In the first embodiment described above, the second measuring unit 70 is arranged after the first transformer 40. However, the invention is not limited thereto. For example, the second measuring unit 70 may be arranged before the first transformer 40 as illustrated in FIG. 17.

Modification 4

Figure 18:
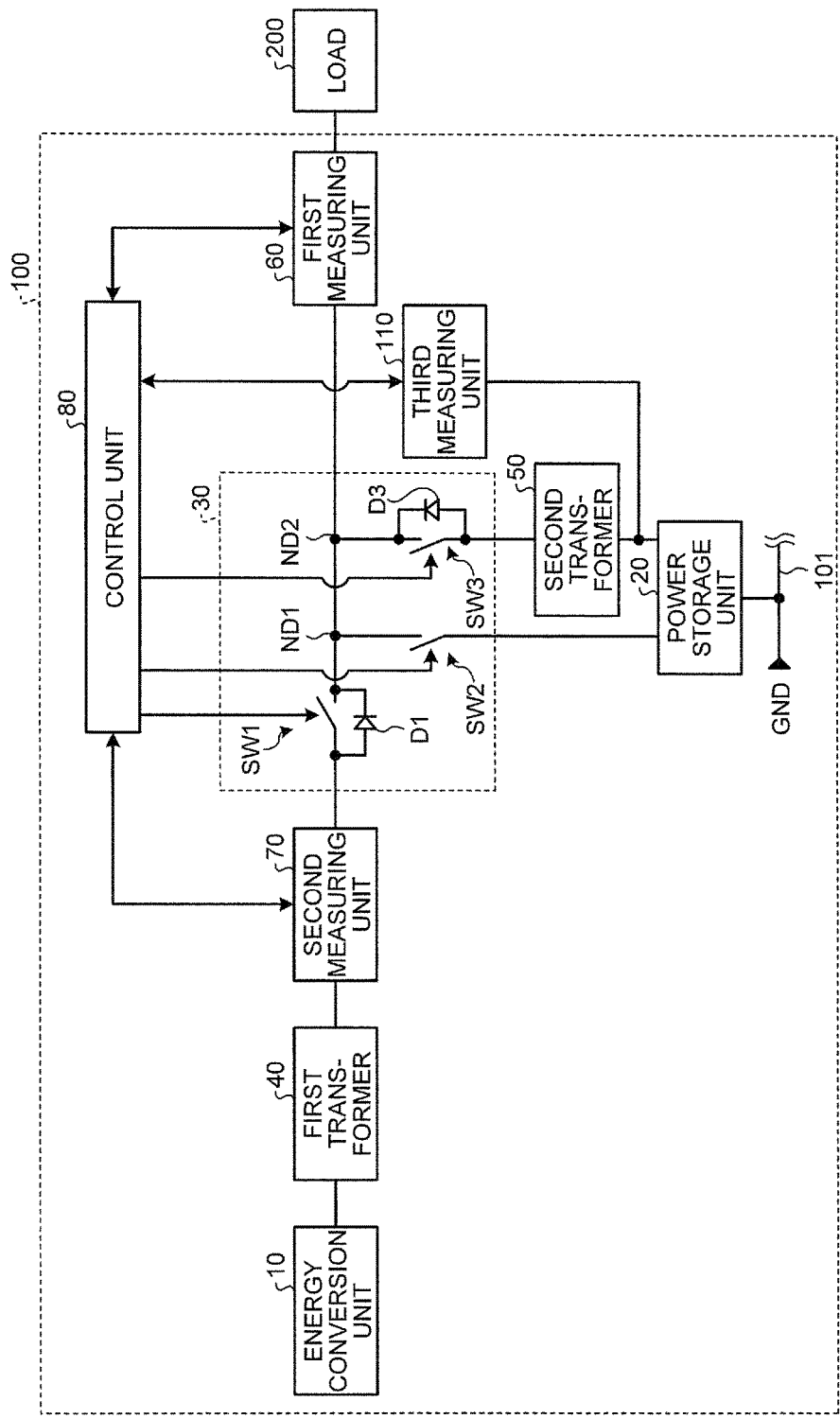
FIG. 18 is a diagram illustrating an example of a configuration of a power supply system according to a modification.

For example, a diode D1 may be provided in parallel with the first switch SW1, and a diode D3 may be provided in parallel with the third switch SW3 as illustrated in FIG. 18. This configuration is supposed to be applied to the power supply system 100 in the first embodiment. However, this configuration can be applied to the power supply system 1000 in the second embodiment. For example, in the first state in which the first switch SW1 and the second switch SW2 are turned on, and the third switch SW3 is turned off, the output voltage from the second transformer 50 to the load 200 is decreased by the diode D3 connected in parallel with the third switch SW3, and the output voltage from the first transformer 40 to the load 200 is not decreased, since it does not pass through the diode D1. Therefore, the output voltage from the first transformer 40 to the load 200 is higher than the output voltage from the second transformer 50 to the load 200, so that the electric power from the energy conversion unit 10 is fed to the load 200.

Even if the generated power by the energy conversion unit 10 is too poor to cover the electric power needed by the load 200, and the output voltage from the first transformer 40 does not reach the minimum operating voltage of the load 200 when the changeover control unit 84 performs the control to change the state to the first state from the second state, the electric power stored in the power storage unit 20 is fed to the load 200 through the diode D3 connected in parallel with the third switch SW3, since the output voltage from the second transformer 50 exceeds the output voltage from the first transformer 40. Therefore, the instantaneous shutoff of the power supply to the load 200 can be prevented. In case where the generated power by the energy conversion unit 10 is small, and the terminal voltage of the power storage unit 20 is smaller than the voltage needed by the load 200 when the changeover control unit 84 performs the control to change the state from the second state to the first state, the power supply to the load 200 might be stopped. However, in the example in FIG. 18, the terminal voltage of the power storage unit 20 increases to the voltage needed by the load 200 by the second transformer 50. This configuration can prevent the power supply to the load 200 from being instantaneously shut off.

Modification 5

Figure 19:
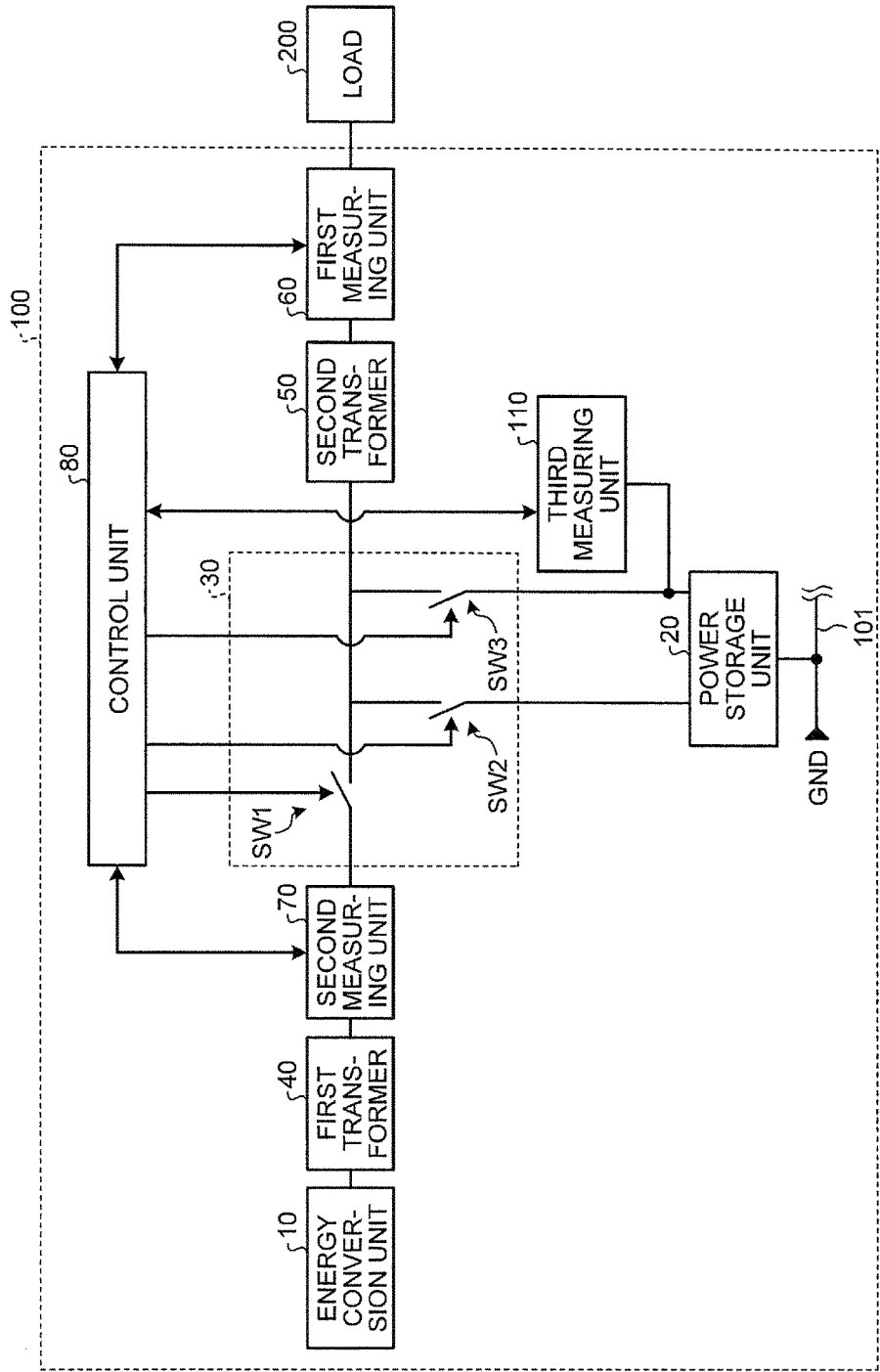
FIG. 19 is a diagram illustrating an example of a configuration of a power supply system according to a modification.

In the first embodiment described above, the second transformer 50 and the first transformer 40 are connected in parallel with each other as illustrated in FIG. 1. However, the second transformer 50 and the first transformer 40 may be connected in series as illustrated in FIG. 19. In the example in FIG. 19, the second transformer 50 is arranged between the changeover unit 30 and the first measuring unit 60.

When the voltage is changed by a regulator, for example, a power loss occurs. Therefore, as illustrated in FIG. 19, a regulator serving as the second transformer 50 is arranged in series with a regulator serving as the first transformer 40. When electric power generated from a solar cell (one example of the energy conversion unit 10) is directly fed to the load 200 (in the case of the first state described above), the power loss occurs twice in the regulator serving as the first transformer 40 and the in the regulator serving as the second transformer 50 until the electric power is fed from the solar cell to the load 200. On the other hand, in the arrangement illustrated in FIG. 1, only the power loss on the regulator serving as the first transformer 40 occurs until the electric power generated by the solar cell is fed to the load 200. Accordingly, the arrangement illustrated in FIG. 1 can bring an advantageous effect of being hardly affected by the power loss of the regulator, compared to the arrangement illustrated in FIG. 19.

Figure 20:
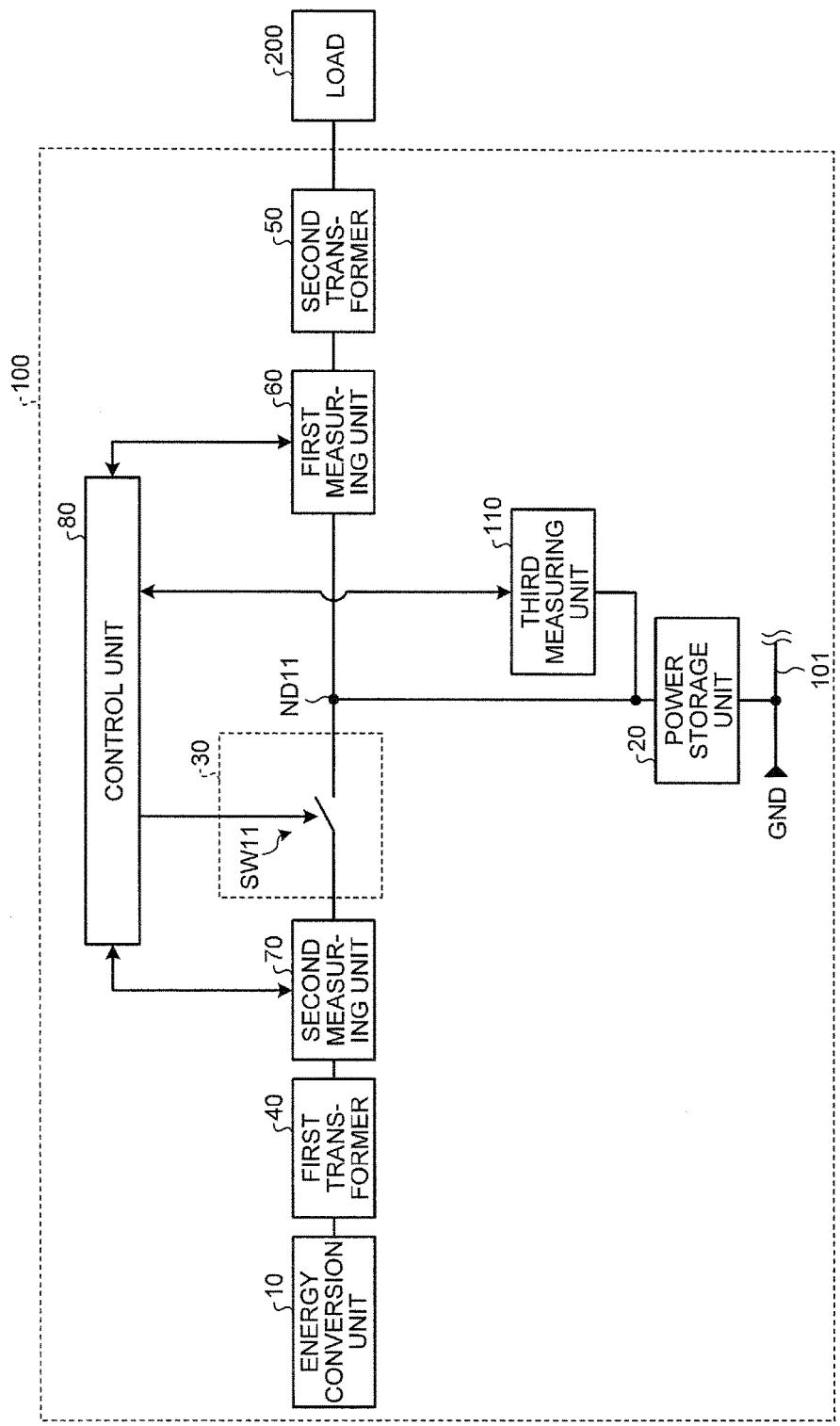
FIG. 20 is a diagram illustrating an example of a configuration of a power supply system according to a modification.

In the example in FIG. 19, the second transformer 50 is arranged between the changeover unit 30 and the second measuring unit 70. However, the invention is not limited thereto. For example, the second transformer 50 may be arranged between the second measuring unit 70 and the load 200 as illustrated in FIG. 20. As illustrated in FIG. 20, the changeover unit 30 may include only one switch SW11. In the example in FIG. 20, the switch SW11 is connected to the energy conversion unit 10 and the load 200 in series, and arranged between the second measuring unit 70 and the first measuring unit 60. In the example in FIG. 20, one electrode of the capacitor forming the power storage unit 20 is connected to a node ND11 on the current path from the switch SW1 to the first measuring unit 60.

In this example, the control unit 80 turns on the switch SW11 in order to bring the power supply system into the first state. Thus, the power supply system is in the state (first state) in which the energy conversion unit 10 and the load 200 are connected to feed the electric power converted by the energy conversion unit 10 to the load 200. The control unit 80 turns off the switch SW11 in order to bring the power supply system into the second state. Thus, the power supply system is in the second state in which the energy conversion unit 10 and the load 200 are not connected, but the power storage unit 20 and the load 200 are connected to feed the electric power stored in the power storage unit 20 to the load 200. In the example in FIG. 20, the selection of the power supply source to the load 200 can be realized by the single switch SW11, which simplifies the configuration.

Figure 21:
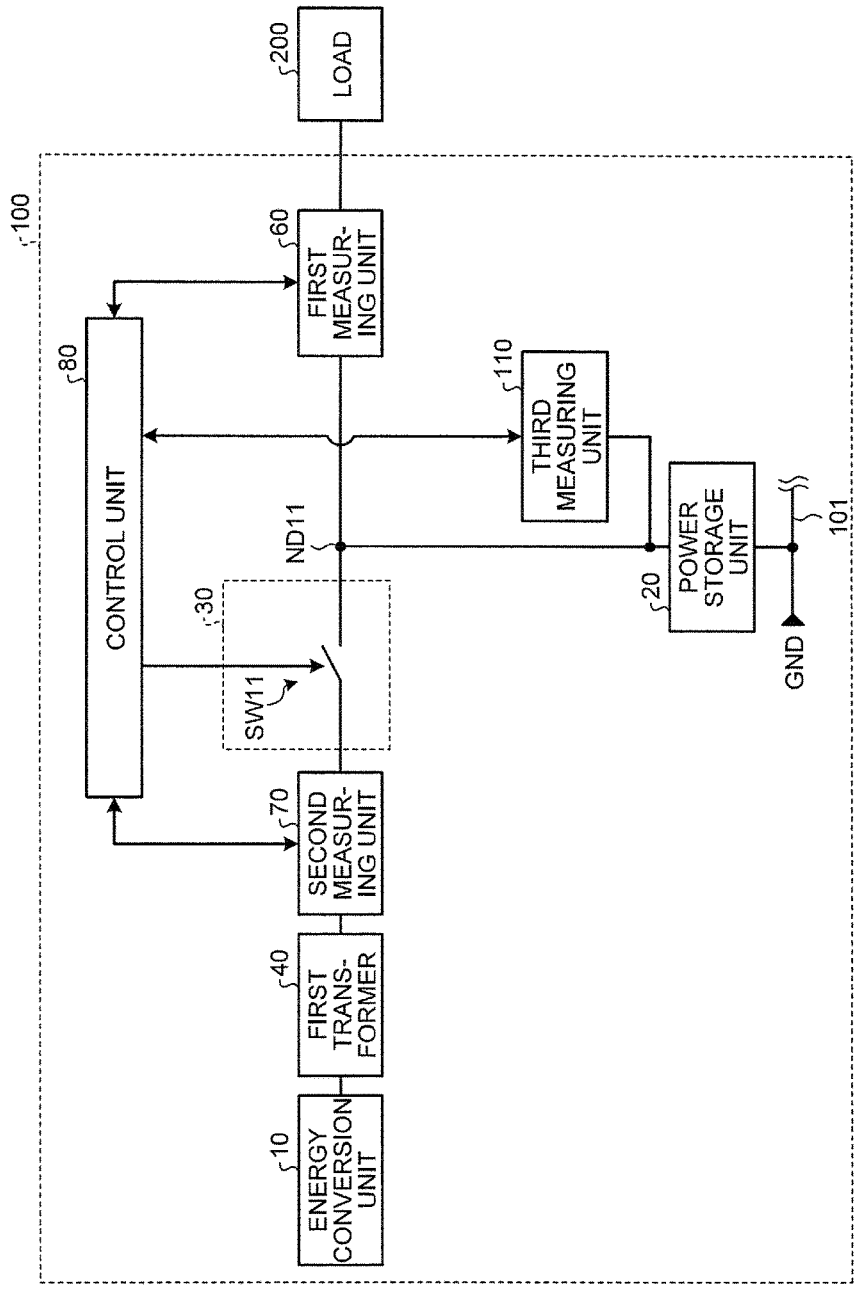
FIG. 21 is a diagram illustrating an example of a configuration of a power supply system according to a modification.

In each embodiment described above, all of the electric power stored in the power storage unit 20 is used up by the second transformer 50. However, the invention is not limited thereto. The second transformer 50 may not be provided as illustrated in FIG. 21, so long as the power supply source can be selected.

In summary, the power supply system may only be configured to include the changeover unit for changing the power supply system to the first state in which the energy conversion unit 10 and the load 200 are connected to feed the electric power converted by the energy conversion unit 10 to the load 200, and to the second state in which the energy conversion unit 10 and the load 200 are not connected, but the power storage unit 20 and the load 200 are connected to feed the electric power stored in the power storage unit 20 to the load 200, wherein the control unit 80 performs the control to change the state to the first state when the conditions are satisfied, and performs the control to change the state to the second state when the conditions are not satisfied.

Modification 6

Figure 22:
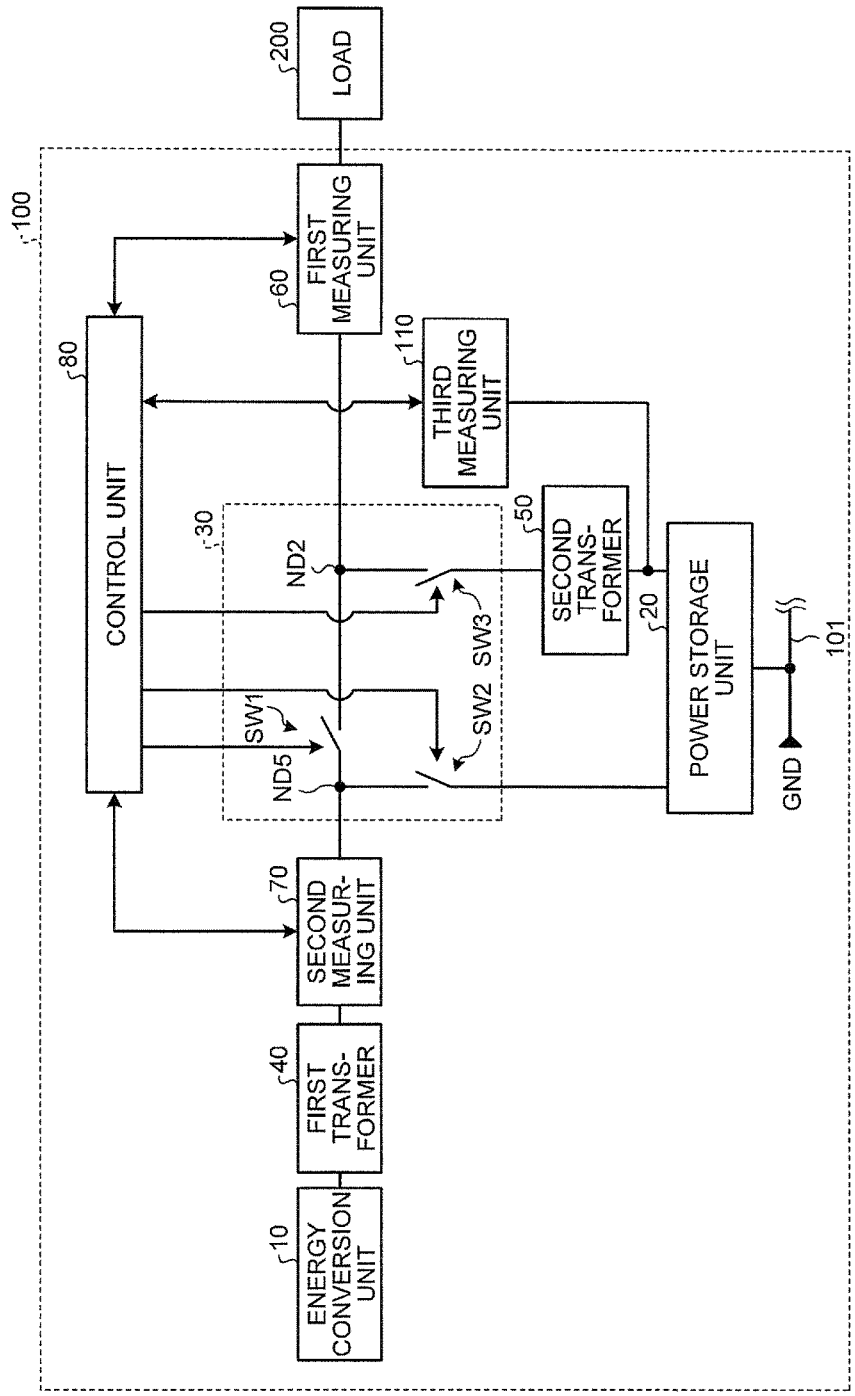
FIG. 22 is a diagram illustrating an example of a configuration of a power supply system according to a modification.

The arrangement of the three switches (SW1, SW2, SW3) forming the changeover unit 30 is not limited to the one described in FIG. 1. For example, these switches may be arranged as illustrated in FIG. 22. In the example in FIG. 22, one end of the second switch SW2 is connected to one electrode of the capacitor serving as the power storage unit 20, while the other end of the second switch SW2 is connected to a node ND5 interposed between the first transformer 40 and the first switch SW1.

Modification 7

Figure 23:
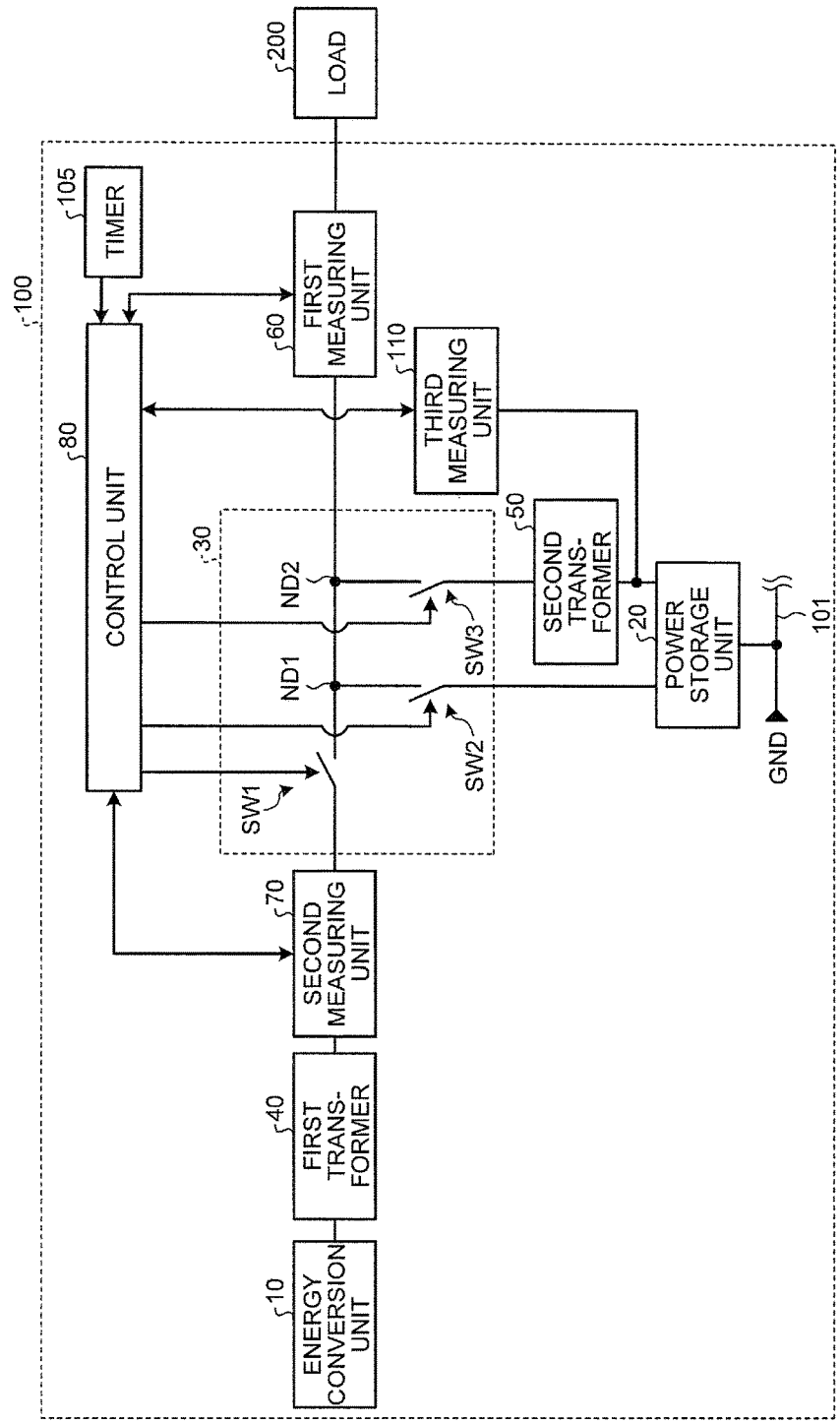
FIG. 23 is a diagram illustrating an example of a configuration of a power supply system according to a modification.

For example, a timer 105 may be provided, and the control unit 80 may start the changeover process described above when receiving an interruption from the timer 105, as illustrated in FIG. 23. The timer 105 may be included in the control unit 80, or may be provided separately from the control unit 80. The configuration is not limited to the timer 105. Any structure may be employed, so long as the changeover process described above is started by using some interruption, such as the interruption from the load 200, as a trigger.

Modification 8

In each embodiment described above, the value of the electric power fed to the load 200 is measured by the first measuring unit 60. However, the invention is not limited thereto. For example, the ADC or the calculator 64 forming the first measuring unit 60 may be included in the control unit 80, and the control unit 80 may calculate the value of the electric power. Similarly, the ADC or the calculator forming the second measuring unit 70 may be included in the control unit 80.

Modification 9

In the embodiments described above, the amount of the electric power (amount of stored power) stored in the capacitor serving as the power storage unit 20 is measured by the third measuring unit 110, and the control unit 80 acquires the result. However, the invention is not limited thereto. For example, the ADC or the calculator 113 forming the third measuring unit 110 may be included in the control unit 80, and the control unit 80 may calculate the amount of stored power.

Modification 10

There is a proportional relation between the value of current flowing through the shunt resistance 61, and the voltage between the resistances. There is also a proportional relation between the value of current flowing through the Hall element 90 and the voltage output from the Hall element 90. Therefore, if the same component is used for the first measuring unit 60 and for the second measuring unit 70, the terminal voltage of the shunt resistance or the output voltage of the Hall element may be compared to select the power supply source without calculating the electric power (or current) by the calculator or the control unit.

Modification 11

There is a proportional relation between the amount of electric power (amount of stored power) stored in the capacitor serving as the power storage unit 20 and the terminal voltage of the capacitor. Therefore, the terminal voltage of the capacitor may be regarded as the amount of stored power without the calculation of the amount of stored power by the calculator 113 or the control unit 80.

Modification 12

Figure 24:
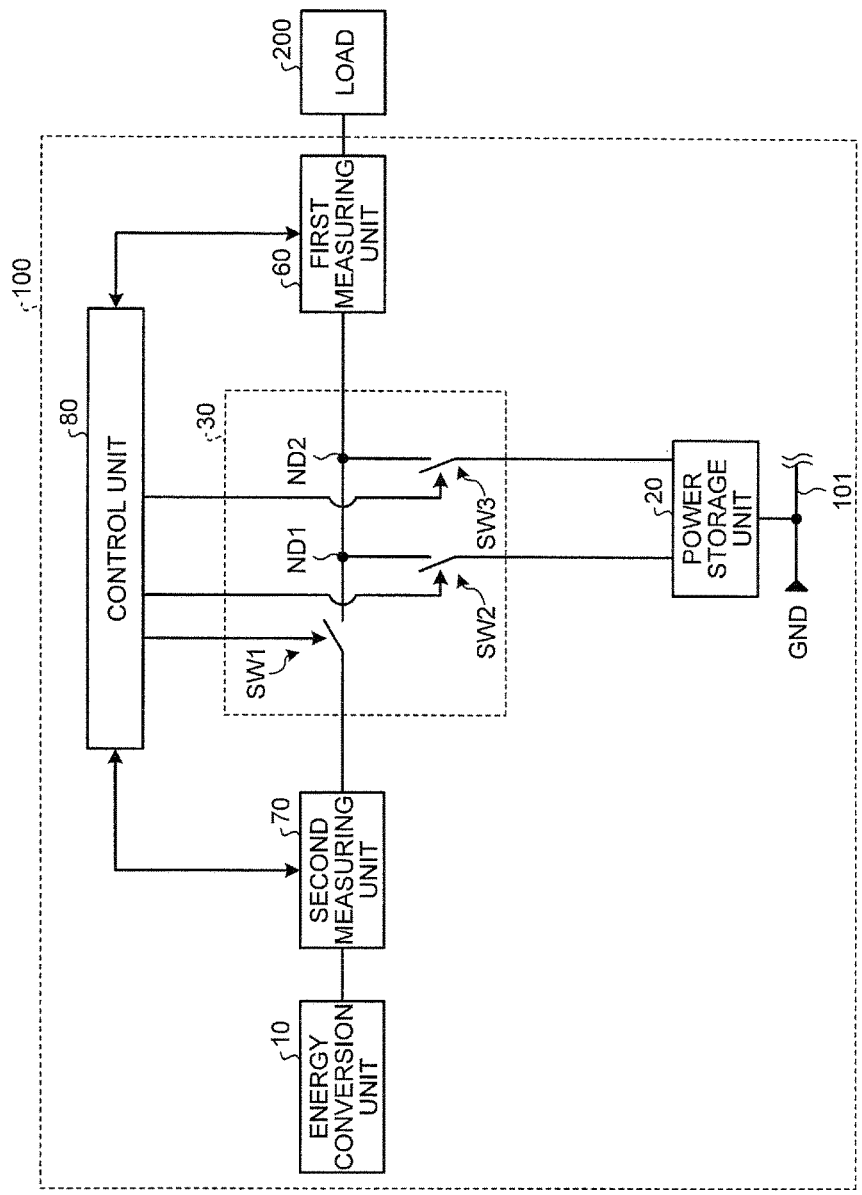
FIG. 24 is a diagram illustrating an example of a configuration of a power supply system according to a modification of the first embodiment.

In the first embodiment, the first transformer 40 and the second transformer 50 may not be provided, so that the electric power fed from the energy conversion unit 10 may directly be input to the second measuring unit 70, and the output voltage from the power storage unit 20 may directly be input to the changeover unit 30, as illustrated in FIG. 24. As illustrated in FIG. 24, the third measuring unit 110 may not be provided. In summary, the power supply system 100 in the first embodiment may be configured to include the energy conversion unit 10 that converts energy other than electricity into electric power, the power storage unit 20 that stores the electric power converted by the energy conversion unit 10, the changeover unit 30 that changes the state of the power supply system to the first state or to the second state, the first measuring unit 60 that measures the electric power fed to the load 200, the second measuring unit 70 that measures the electric power fed from the energy conversion unit 10, and the control unit 80 that changes the state of the power supply system to the first state, when the value obtained by subtracting the first value from the value of the electric power measured by the second measuring unit 70 is not less than the value of the electric power measured by the first measuring unit 60, and changes the state to the second state, when the value obtained by subtracting the first value from the value of the electric power measured by the second measuring unit 70 is less than the value of the electric power measured by the first measuring unit 60.

Similarly, in the second embodiment, the first transformer 40, the second transformer 50, and the third measuring unit 110 may not be provided, for example, as illustrated in FIG. 25. In summary, the power supply system 1000 according to the second embodiment may be configured to include the energy conversion unit 10 that converts energy other than electricity into electric power, the power storage unit 20 that stores the electric power converted by the energy conversion unit 10, the changeover unit 30 that changes the state of the power supply system to the first state or to the second state, the first measuring unit 60 that measures the electric power fed to the load 200, and the control unit 800 that changes the state to the first state, when the value of the electric power measured by the first measuring unit 60 is less than the second threshold value, and changes the state to the second state, when the value of the electric power measured by the first measuring unit 60 is not less than the second threshold value.

Still alternatively, the programs to be executed by the control unit (80, 800) described above may be stored on a computer system connected to a network such as the Internet, and provided by being downloaded via the network. Still alternatively, the programs to be executed by the control unit (80, 800) described above may be provided or distributed through a network such as the Internet. Still alternatively, the programs to be executed by the control unit (80, 800) described above may be stored in a computer-readable storage medium such as a CD, a DVD, and a ROM in advance and provided as a computer program product.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power supply system comprising:
    a power generation unit;
    a power storage unit configured to store electric power generated by the power generation unit;
    a changeover unit configured to make a changeover between a first state in which the power generation unit and a load are connected to feed the electric power generated by the power generation unit to the load and a second state in which no electric power is fed from the power generation unit to the load and in which the power storage unit and the load are connected to feed the electric power stored in the power storage unit to the load;
    a first measuring unit configured to measure electric power fed to the load;
    a second measuring unit configured to measure electric power fed from the power generation unit;
    a third measuring unit configured to measure an amount of stored power in the power storage unit;
    a control unit configured to
        perform control to make the changeover to the first state when a value obtained by subtracting a first value from a value of the electric power measured by the second measuring unit is not less than a value of the electric power measured by the first measuring unit, the first value being a fixed value,
        perform control to make the changeover to the second state when the value obtained by subtracting the first value from the value of the electric power measured by the second measuring unit is less than the value of the electric power measured by the first measuring unit, and
        perform control to make the changeover to the first state when conditions in which the amount of stored power measured by the third measuring unit is less than a first threshold value and the value obtained by subtracting the first value from the value of the electric power measured by the second measuring unit is not less than the value of the electric power measured by the first measuring unit are satisfied, and
        perform control to make the changeover to the second state when the conditions are not satisfied; and
    a transformer configured to step up an output voltage of the power storage unit to a predetermined voltage, the transformer being arranged between the power storage unit and the load.

2. A power supply system comprising:
    a power generation unit;
    a power storage unit configured to store electric power generated by the power generation unit;
    a changeover unit configured to make a changeover between a first state in which the power generation unit and a load are connected to feed the electric power generated by the power generation unit to the load and a second state in which no electric power is fed from the power generation unit to the load and in which the power storage unit and the load are connected to feed the electric power stored in the power storage unit to the load;
    a first measuring unit configured to measure electric power fed to the load;
    a second measuring unit configured to measure electric power fed from the power generation unit;
    a third measuring unit configured to measure an amount of stored power in the power storage unit; and
    a control unit configured to
        perform control to make the changeover to the first state when a value obtained by subtracting a first value from a value of the electric power measured by the second measuring unit is not less than a value of the electric power measured by the first measuring unit, the first value being a variably settable value, perform control to make the changeover to the second state when the value obtained by subtracting the first value from the value of the electric power measured by the second measuring unit is less than the value of the electric power measured by the first measuring unit, perform control to make the changeover to the first state when conditions in which the amount of stored power measured by the third measuring unit is less than a first threshold value and the value obtained by subtracting the first value from the value of the electric power measured by the second measuring unit is not less than the value of the electric power measured by the first measuring unit are satisfied, and perform control to make the changeover to the second state when the conditions are not satisfied; and a transformer configured to step up an output voltage of the power storage unit to a predetermined voltage, the transformer being arranged between the power storage unit and the load.

3. The system according to claim 2, wherein the first value is a value that varies according to a value of the electric power fed from the power generation unit.

* * * * *